(12) United States Patent
Thomas et al.

(10) Patent No.: US 10,862,513 B2
(45) Date of Patent: Dec. 8, 2020

(54) DATA PROCESSING UNIT HAVING HARDWARE-BASED PARALLEL VARIABLE-LENGTH CODEWORD DECODING

(71) Applicant: Fungible, inc., Santa Clara, CA (US)

(72) Inventors: Philip A. Thomas, San Jose, CA (US); Edward David Beckman, Santa Clara, CA (US); Rajan Goyal, Saratoga, CA (US); Satyanarayana Lakshmipathi Billa, Sunnyvale, CA (US)

(73) Assignee: Fungible, Inc., Santa Clara, CA (US)

( * ) Notice: Subject to any disclaimer, the term of this patent is extended or adjusted under 35 U.S.C. 154(b) by 23 days.

(21) Appl. No.: 16/249,658

(22) Filed: Jan. 16, 2019

(65) Prior Publication Data

US 2020/0228148 A1    Jul. 16, 2020

(51) Int. Cl.
*H03M 13/00* (2006.01)

(52) U.S. Cl.
CPC ... *H03M 13/6561* (2013.01); *H03M 13/6318* (2013.01)

(58) Field of Classification Search
CPC ............. H03M 7/4037; H03M 7/6017; H03M 7/6023; H03M 7/6005; H03M 7/3084; H03M 7/60; H03M 13/6561; H03M 13/6318
See application file for complete search history.

(56) References Cited

U.S. PATENT DOCUMENTS

| | | | |
|---|---|---|---|
| 6,985,633 B2* | 1/2006 | Weiss | G06F 9/3017 341/65 |
| 9,252,805 B1* | 2/2016 | Abali | H03M 7/40 |
| 10,020,819 B1* | 7/2018 | Diamant | H03M 7/4037 |
| 2017/0187388 A1* | 6/2017 | Satpathy | H03M 7/6017 |
| 2018/0287965 A1 | 10/2018 | Sindhu et al. | |
| 2018/0293168 A1 | 10/2018 | Noureddine et al. | |
| 2019/0012278 A1 | 1/2019 | Sindhu et al. | |
| 2019/0013965 A1 | 1/2019 | Sindhu et al. | |

FOREIGN PATENT DOCUMENTS

EP    2362547 A1    8/2011

OTHER PUBLICATIONS

Deutsch, "Deflate Compressed Data Format Specification version 1.3," RFC 1951, May 1996, 15 pp.
Deutsch, "GZIP file format specification version 4.3," RFC 1952, May 1996, 11 pp.
U.S. Appl. No. 15/949,692, filed Apr. 10, 2018, naming inventors Noureddine et al.

(Continued)

*Primary Examiner* — Guerrier Merant
(74) *Attorney, Agent, or Firm* — Shumaker & Sieffert, P.A.

(57) ABSTRACT

A highly programmable device, referred to generally as a data processing unit, having multiple processing units for processing streams of information, such as network packets or storage packets, is described. The data processing unit includes one or more specialized hardware accelerators configured to perform acceleration for various data-processing functions. This disclosure describes a parallel decoding of codewords within input data stream based on a codeword type and position.

21 Claims, 9 Drawing Sheets

(56) References Cited

OTHER PUBLICATIONS

U.S. Appl. No. 16/197,179, filed Nov. 20, 2018, naming inventors Gray et al.
International Search Report and Written Opinion of International Application No. PCT/US2020/013726, dated May 12, 2020, 14 pp.
Deutsch, "Deflate Compressed Data Format Specification version 1.3," Internet Draft Deflate 1.3, Feb. 1, 1996, 15 pp.
Nikara et al., "Multiple-Symbol Parallel Decoding for Variable Length Codes," IEEE Transactions on Very Large Scale Integration (VLSI) Systems, vol. 12, No. 4, Apr. 2004, 10 pp.

\* cited by examiner

DATA PROCESSING UNIT HAVING HARDWARE-BASED PARALLEL VARIABLE-LENGTH CODEWORD DECODING

TECHNICAL FIELD

The disclosure relates to processing packets of information, for example, in the fields of networking and storage.

BACKGROUND

In a typical computer network, a large collection of interconnected servers provides computing and/or storage capacity for execution of various applications. A data center is one example of a large-scale computer network and typically hosts applications and services for subscribers, i.e., customers of the data center. The data center may, for example, host all of the infrastructure equipment, such as compute nodes, networking and storage systems, power systems, and environmental control systems. In most data centers, clusters of storage systems and application servers are interconnected via a high-speed switch fabric provided by one or more tiers of physical network switches and routers. Data centers vary greatly in size, with some public data centers containing hundreds of thousands of servers, and are usually distributed across multiple geographies for redundancy.

Many devices within a computer network, e.g., storage/compute servers, firewalls, intrusion detection devices, switches, routers or other network attached devices, often use general purpose processors, including multi-core processing systems, to process data, such as network or storage data. However, general purpose processing cores and multi-processing systems are normally not designed for high-capacity network and storage workloads of modern network and can be relatively poor at performing packet stream processing.

SUMMARY

In general, this disclosure describes a highly programmable device, referred to generally as a data processing unit, having multiple processing units for processing streams of information, such as network packets or storage packets. In some examples, the processing units may be processing cores, and in other examples, the processing units may be virtual processors, hardware threads, hardware blocks, or other sub-processing core units. As described herein, the data processing unit includes one or more specialized hardware-based accelerators configured to perform acceleration for various data-processing functions, thereby offloading tasks from the processing units.

In various examples, this disclosure describes a decoder of the data processing unit for performing parallel decoding of a variable-length encoded data stream. In variable-length coding, a particular codeword, comprising ones and zeros, represents a particular symbol, where longer codewords represent symbols that occur less frequently in the data stream, and shorter codewords represent symbols that occur more frequency in the data stream. Because the length of a codeword is variable, a decoder may not be configured to demarcate codewords within the data stream until after decoding a codeword (i.e., may be not be possible to a priori identify codewords in a data stream). Accordingly, some techniques perform serial decoding on the data stream, which can limit throughput (e.g., the next codeword is not processed until the previous codeword is processed).

The example techniques described in this disclosure process many potential codewords within a data stream portion in parallel to determine whether a potential codeword is an actual, valid codeword. The decoder determines whether a potential codeword is an actual, valid codeword based on the type of codeword and its position relative to other codewords. The decoder may then determine symbols of the valid codewords. Because the decoder determines actual, valid codewords in the same data stream in parallel, the decoder may include multiple decoder pipelines configured to determine the symbol for each of the valid codewords in parallel. Accordingly, the example techniques describe for a way in which to parallel decode variable-length encoded payload, thereby increasing throughput, e.g., number of bits/bytes of the data stream processed per clock cycle.

In one example, the disclosure describes a method of codeword processing, the method comprising identifying, with a plurality of detector circuits operating in parallel starting from respective bits of sequential bits of an input data stream, one or more codewords within the input data stream, determining, with the plurality of detector circuits operating in parallel, type values for the one or more identified codewords, determining, with a plurality of fuser circuits, whether codewords identified from one or more of the plurality of detector circuits are combinable with codewords identified by other ones of the plurality of detector circuits to generate a plurality of super codewords based on respective type values of the codewords, generating, with one or more of the fuser circuits, the plurality of super codewords based on the determination of whether the codewords are combinable, and prefix-free, variable length decoding the input data stream based on one or more of the generated super codewords.

In one example, the disclosure describes a device for codeword processing, the device comprising a memory configured to store bits of an input data stream, a plurality of detector circuits, operating in parallel starting from respective bits of sequential bits of the input data stream, configured to identify one or more codewords within the input data stream and determine type values for the one or more identified codewords. The device also includes a plurality of fuser circuits configured to determine whether codewords identified from one or more of the plurality of detector circuits are combinable with codewords identified by other ones of the plurality of detector circuits to generate a plurality of super codewords based on respective type values of the codewords, and generate the plurality of super codewords based on the determination of whether the codewords are combinable. The device also includes a plurality of decoder pipeline circuits configured to prefix-free, variable length decode the input data stream based on one or more of the generated super codewords.

The details of one or more examples are set forth in the accompanying drawings and the description below. Other features, objects, and advantages of the invention will be apparent from the description and drawings, and from the claims.

DETAILED DESCRIPTION

Figure 1:
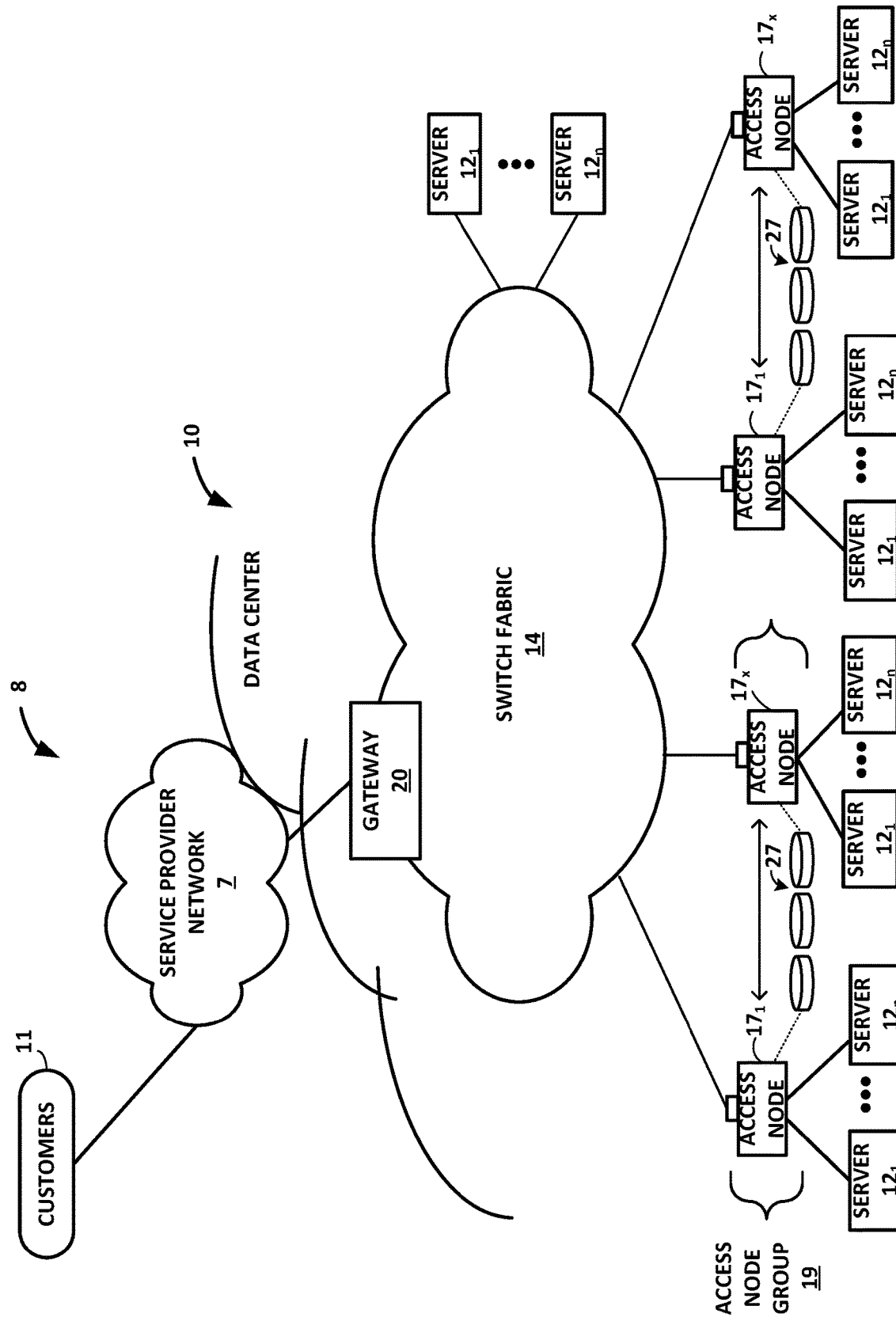
FIG. 1 is a block diagram illustrating an example system including one or more network devices configured to efficiently process a series of work units in a multiple core processor system.

FIG. 1 is a block diagram illustrating an example system 8 including one or more network devices configured to efficiently process a series of work units in a multiple core processor system. As described herein, techniques for parallel decoding variable-length encoded data may provide technical benefits that include improving the throughput and utilization of processing cores within access nodes 17 in FIG. 1.

Access nodes 17 may also be referred to as data processing units (DPUs), or devices including DPUs, in this disclosure. In the example of FIG. 1, various data structures and processing techniques are described with respect to access nodes 17 within a data center 10. Other devices within a network, such as routers, switches, servers, firewalls, gateways and the like, having multiple core processor systems may readily be configured to utilize the data processing techniques described herein.

Data center 10 represents an example of a system in which various techniques described herein may be implemented. In general, data center 10 provides an operating environment for applications and services for customers 11 coupled to the data center by service provider network 7 and gateway device 20. Data center 10 may, for example, host infrastructure equipment, such as compute nodes, networking and storage systems, redundant power supplies, and environmental controls. Service provider network 7 may be coupled to one or more networks administered by other providers, and may thus form part of a large-scale public network infrastructure, e.g., the Internet. In other examples, content/service provider network 107 may be a data center wide-area network (DC WAN), private network or other type of network.

In some examples, data center 10 may represent one of many geographically distributed network data centers. In the example of FIG. 1, data center 10 is a facility that provides information services for customers 11. Customers 11 may be collective entities such as enterprises and governments or individuals. For example, a network data center may host web services for several enterprises and end users. Other exemplary services may include data storage, virtual private networks, file storage services, data mining services, scientific- or super-computing services, and so on.

In the illustrated example, data center 10 includes a set of storage systems and application servers 12 interconnected via a high-speed switch fabric 14. In some examples, servers 12 are arranged into multiple different server groups, each including any number of servers up to, for example, n servers $12_1$-$12_n$. Servers 12 provide computation and storage facilities for applications and data associated with customers 11 and may be physical (bare-metal) servers, virtual machines running on physical servers, virtualized containers running on physical servers, or combinations thereof.

In the example of FIG. 1, each of servers 12 is coupled to switch fabric 14 by an access node 17 for processing streams of information, such as network packets or storage packets. In example implementations, access nodes 17 may be configurable to operate in a standalone network appliance having one or more access nodes. For example, access nodes 17 may be arranged into multiple different access node groups 19, each including any number of access nodes up to, for example, x access nodes $17_1$-$17_x$. In other examples, each access node may be implemented as a component (e.g., electronic chip) within a device, such as a compute node, application server, storage server, and may be deployed on a motherboard of the device or within a removable card, such as a storage and/or network interface card.

In general, each access node group 19 may be configured to operate as a high-performance I/O hub designed to aggregate and process network and/or storage I/O for multiple servers 12. As described above, the set of access nodes 17 within each of the access node groups 19 provide highly-programmable, specialized I/O processing circuits for handling networking and communications operations on behalf of servers 12. In addition, in some examples, each of access node groups 19 may include storage devices 27, such as solid state drives (SSDs) and/or hard disk drives (HDDs), configured to provide network accessible storage for use by applications executing on the servers 12. In some examples, one or more of the SSDs may comprise non-volatile memory (NVM) or flash memory. Each access node group 19, including its set of access nodes 17 and storage devices 27, and the set of servers 12 supported by the access nodes 17 of that access node group 19 may be referred to herein as a network storage compute unit.

As further described herein, in one example, each access node 17 is a highly programmable I/O processor (referred to as a DPU) specially designed for offloading certain functions from servers 12. In one example, each access node 17 includes a number of internal processor clusters, each including two or more processing cores and equipped with hardware engines that offload cryptographic, compression and decompression, and regular expression (RegEx) processing, data storage functions and networking operations. In this way, each access node 17 includes components for fully implementing and processing network and storage stacks on behalf of one or more servers 12. In addition, access nodes 17 may be programmatically configured to serve as a security gateway for its respective servers 12, freeing up the processors of the servers to dedicate resources to application workloads. In some example implementations, each access node 17 may be viewed as a network interface subsystem that implements full offload of the handling of data packets (with zero copy in server memory) and storage acceleration for the attached server systems. In one example, each access node 17 may be implemented as one or more application-specific integrated circuit (ASIC) or other hardware and software components, each supporting a subset of the servers. Additional example details of various example DPUs are described in U.S. Provisional Patent Application No. 62/559,021, filed Sep. 15, 2017, and U.S. patent application Ser. No. 16/031,676, filed Jul. 10, 2018, entitled "Access Node for Data Centers," and U.S. Provisional Patent Application No. 62/530,691, filed Jul. 10, 2017, entitled "Data Processing Unit for Computing Devices," and U.S. patent application Ser. No. 16/031,921, filed Jul. 10, 2018, entitled "Data Processing Unit for Compute Nodes and Storage Nodes," the entire contents of each being incorporated herein by reference.

In accordance with the techniques of this disclosure, any or all of access nodes 17 may include a data compression/decompression accelerator unit. That is, one or more computing devices may include an access node including one or more data compression/decompression accelerator units, according to the techniques of this disclosure.

The data compression/decompression accelerator unit of the access node may be configured to process payloads of packets during various services as the packets are exchanged by access nodes 17, e.g., between access nodes 17 via switch fabric 14 and/or between servers 12. That is, as packets are exchanged between the devices, either for networking or for data storage and retrieval, the access node may perform data compression on payloads of the packet. For example, the access node may use one or more data compression/decompression accelerator units to perform dictionary-based compression followed by entropy encoding.

In addition to dictionary-based compression followed by entropy encoding, the data compression/decompression accelerator unit may be configured to perform the inverse process of entropy decoding followed by dictionary-based decompression to reconstruct the payloads of packets. One example of the entropy encoding is prefix-free, variable-length encoding, such as Huffman encoding. In prefix-free, variable length encoding, symbols are assigned codewords of variable length based on the frequency of the symbols in the payload or in a pre-configured dictionary. For instance, more frequently occurring symbols are assigned shorter codewords, and less frequency occurring symbols are assigned longer codewords. A codeword is a series of digital bits (e.g., ones and zeros), and the length of the codeword refers to the number of bits in the codeword. Hence, the prefix-free, variable length encoding also generates variable length codewords.

In prefix-free, variable length encoding, the codewords have the property that a codeword cannot be a prefix for any other codeword. As an example, assume that the codeword for symbol 'a' is 100. In this example, the codeword for symbol 'b' cannot be 1001 or 1000 because the prefix 100 for 1001 or 1000 is already the codeword for symbol 'a'.

In some techniques, the data compression/decompression accelerator unit process an input data stream having the codewords serially. For example, the data compression/decompression accelerator unit stores a codeword table that identifies symbols for each of the codewords. In these techniques, the data compression/decompression accelerator unit parses bits in the data stream serially until the data compression/decompression accelerator unit identifies a series of bits that together form a codeword (e.g., by comparing the bits to codewords in the codeword table). The prefix-free characteristic of the codewords ensures that when a data compression/decompression accelerator unit identifies a codeword in the data stream, the data compression/decompression accelerator unit identified a complete codeword, rather than merely part of a larger codeword, because the identified codeword cannot be a prefix for another codeword.

The serial processing of the data stream to identify codewords may limit processing throughput because only one codeword can be identified at a time. This disclosure describes example techniques for parallel processing of the data stream to identify a plurality of codewords in parallel (e.g., at or approximately the same time). As described in more detail, the data compression/decompression accelerator unit includes a plurality of detector circuits that identify codewords from the data stream starting from sequential bits in the data stream.

However, not all of the identified codewords may be valid codewords. For example, with serial processing, the data compression/decompression accelerator unit may identify a series of bits that together form a codeword. In one or more examples of the parallel processing techniques described in this disclosure, the data compression/decompression accelerator unit may identify codewords starting from the middle of the series of bits that together form a codeword. However, these identified codewords would have never been determined as codewords through serial processing, and therefore, are not valid codewords.

In one or more examples, the data compression/decompression accelerator unit determines which of the identified codewords are valid codewords based on characteristics of the codewords such as location of the codewords in the data stream. The data compression/decompression accelerator unit may then further process the outputs of detector circuits having valid codewords. For example, the data compression/decompression accelerator unit may determine codewords that are potentially valid codewords based on type and location in the bitstream and may determine which of these codewords are valid codewords based on determining the current decoding location in the bitstream. As an example, the data compression/decompression accelerator unit may fuse together a plurality of potentially valid codewords based on their type and locations in the bitstream. Based on the current decoding location and the number of bits in the fused potentially valid codewords, a selector circuit of the accelerator unit may output the fused potentially valid codewords, but skip over (e.g., discard) other potentially valid codewords. In some examples, the codewords that the selector circuit outputs are the actual valid codewords, and the remainder of the potentially valid codewords are not valid codewords.

In the example of FIG. 1, each access node 17 provides connectivity to switch fabric 14 for a different group of servers 12 and may be assigned respective IP addresses and provide routing operations for the servers 12 coupled thereto. Access nodes 17 may interface with and utilize switch fabric 14 so as to provide full mesh (any-to-any) interconnectivity such that any of servers 12 may communicate packet data for a given packet flow to any other of the servers using any of a number of parallel data paths within the data center 10. In addition, access nodes 17 described herein may provide additional services, such as storage (e.g., integration of solid-state storage devices), security (e.g., encryption), acceleration (e.g., compression), I/O offloading, and the like. In some examples, one or more of access nodes 17 may include storage devices, such as high-speed solid-state drives or rotating hard drives, configured to provide network accessible storage for use by applications executing on the servers. More details on the example data center network architecture and interconnected access nodes illustrated in FIG. 1 are available in U.S. patent application Ser. No. 15/939,227, filed Mar. 28, 2018, entitled "Non-Blocking Any-to-Any Data Center Network with Packet Spraying Over Multiple Alternate Data Paths," the entire content of which is incorporated herein by reference.

Various example architectures of access nodes 17 are described below with respect to FIGS. 2, 3, and 4. With respect to the examples, the architecture of each access node 17 comprises a multiple core processor system that represents a high performance, hyper-converged network, storage, and data processor and input/output hub. The architecture of each access node 17 is optimized for high performance and high efficiency stream processing. For example, by performing parallel decoding of variable length codewords, the example techniques may promote faster throughput as compared to serial decoding of variable length codewords, because the data compression/decompression accelerator unit can identify many codewords in parallel.

In general, a stream, also referred to as a data stream, may be viewed as an ordered, unidirectional sequence of computational objects that can be of unbounded or undetermined length. In a simple example, a data stream originates in a producer and terminates at a consumer, is operated on sequentially, and is flow-controlled. In some examples, a data stream can be defined as a sequence of stream fragments, each representing a portion of data communicated by a data stream. In one example, a stream fragment may include a memory block contiguously addressable in physical address space, an offset into that block, and a valid length. Data streams can be discrete, such as a sequence of packets received from a network, or continuous, such as a stream of blocks, words or bytes read from a storage device. A data stream of one type may be transformed into another type as a result of processing. Independent of the data stream type, data stream manipulation requires efficient fragment manipulation. An application executing on one of access nodes 17 may operate on a data stream in three example broad ways: the first is protocol processing, which includes operating on control information or headers within the stream; the second is payload processing, which involves significant accessing of the data within the stream; and third is some combination of both control and data access.

Data stream processing is a specialized type of conventional general-purpose processing supporting specialized limitations with regard to both access and directionality. Processing typically only accesses a limited portion of the stream at any time, called a "window," within which it may access random addresses. Objects outside of the window are not accessible through a streaming interface. In contrast, general purpose processing views the whole memory as randomly accessible at any time. In addition, data stream processing generally progresses in one direction, called the forward direction. These characteristics make data stream processing amenable to pipelining, as different processors within one of access nodes 17 can safely access different windows within the stream.

As described herein, data processing units of access nodes 17 may process data stream information by managing "work units." In general, a work unit (WU) is a container that is associated with a stream state and used to describe (i.e. point to) data within a stream (stored in memory) along with any associated meta-data and operations to be performed on the data. In the example of FIG. 1, data streams of data units may dynamically originate within a peripheral unit of one of access nodes 17 (e.g. injected by a networking unit, a host unit, or a solid state drive interface), or within a processor of the one of access nodes 17, in association with one or more data streams of data, and terminate at another peripheral unit or another processor of the one of access nodes 17. Each work unit maintained by a data processing unit is associated with an amount of work that is relevant to the entity executing the work unit for processing a respective portion of a data stream.

Data stream processing is typically initiated as a result of receiving one or more data units associated with respective portions of the data stream and constructing and managing work units for processing respective portions of the data stream. In protocol processing, a portion would be a single buffer (e.g. packet), for example. Within access nodes 17, work units may be executed by processor cores, hardware blocks, I/O interfaces, or other computational processing units. For instance, a processor core of an access node 17 executes a work unit by accessing the respective portion of the data stream from memory and performing one or more computations in accordance with the work unit. A component of the one of access nodes 17 may receive, execute or generate work units. A succession of work units may define how the access node processes a flow, and smaller flows may be stitched together to form larger flows.

For purposes of example, DPUs of or within each access node 17 may execute an operating system, such as a general-purpose operating system (e.g., Linux or other flavor of Unix) or a special-purpose operating system, that provides an execution environment for data plane software for data processing. Moreover, each DPU may be configured to utilize a work unit (WU) stack data structure (referred to as a 'WU stack' in a multiple core processor system. As described herein, the WU stack data structure may provide certain technical benefits, such as helping manage an event driven, run-to-completion programming model of an operating system executed by the multiple core processor system. The WU stack, in a basic form, may be viewed as a stack of continuation WUs used in addition to (not instead of) a program stack maintained by the operating system as an efficient means of enabling program execution to dynamically move between cores of the access node while performing high-rate stream processing. As described below, a WU data structure is a building block in the WU stack and can readily be used to compose a processing pipeline and services execution in a multiple core processor system. The WU stack structure carries state, memory, and other information in auxiliary variables external to the program stack for any given processor core. In some implementations, the WU stack may also provide an exception model for handling abnormal events and a 'success bypass' to shortcut a long series of operations. Further, the WU stack may be used as an arbitrary flow execution model for any combination of pipelined or parallel processing.

As described herein, access nodes 17 may process WUs through a plurality of processor cores arranged as processing pipelines within access nodes 17, and such processing cores may employ techniques to encourage efficient processing of such work units and high utilization of processing resources. For instance, a processing core (or a processing unit within a core) may, in connection with processing a series of work units, access data and cache the data into a plurality of segments of a level 1 cache associated with the processing core. In some examples, a processing core may process a work unit and cache data from non-coherent memory in a segment of the level 1 cache. The processing core may also concurrently prefetch data associated with a work unit expected to be processed in the future into another segment of the level 1 cache associated with the processing core. By prefetching the data associated with the future work unit in advance of the work unit being dequeued from a work unit queue for execution by the core, the processing core may be able to efficiently and quickly process a work unit once the work unit is dequeued and execution of the work unit is to commence by the processing core. More details on work units and stream processing by data processing units of access nodes are available in U.S. Provisional Patent Application No. 62/589,427, filed Nov. 21, 2017, entitled "Work Unit Stack Data Structures in Multiple Core Processor System," and U.S. Provisional Patent Application No. 62/625,518, entitled "EFFICIENT WORK UNIT PROCESSING IN A MULTICORE SYSTEM", filed Feb. 2, 2018, the entire contents of both being incorporated herein by reference.

As described herein, the data processing units for access nodes 17 includes one or more specialized hardware-based accelerators configured to perform acceleration for various data-processing functions, thereby offloading tasks from the processing units when processing work units. That is, each accelerator is programmable by the processing cores, and one or more accelerators may be logically chained together to operate on stream data units, such as by providing cryptographic functions, compression and regular expression (RegEx) processing, data storage functions and networking operations.

A data compression/decompression accelerator unit of a data processing unit may include a hardware pipeline for performing dictionary-based compression. The disclosed dictionary-based compression hardware pipeline, referred to herein as a "search block," is configured to perform string search and replacement functions to compress an input data file. In some examples, the search block performs a first stage of a two-stage compression process performed by the data compression/decompression accelerator unit. The second stage of the compression/decompression process includes entropy coding, which may be performed using either a prefix-free, variable length coding block, such as a Huffman coding block, or a Range coding block. For decompression, a first stage of a two-stage decompression process performed by the data compression/decompression accelerator unit includes entropy decoding or Range decoding, and a second stage includes dictionary-based decompression. One or more examples are described with respect to the decompression process of the data compression/decompression accelerator unit, such as entropy decoding (e.g., the prefix-free, variable length decoding of variable length codewords) performed by a decoder circuit in the Huffman coding block.

As described in more detail below, part of the first stage of the two-stage compression process includes determining literals, and length-distance pairs in an input data file. Literals directly represent the original data (i.e., string of bytes), and the length-distance pairs are pointers to previous occurrences of a string of bytes within a sliding history window. The length-distance pairs may include a length value and a distance value. The second stage of the two-stage compression includes converting the literal, length, and distance values into codewords, such as via entropy encoding techniques.

In one or more examples, the decoder of a data compression/decompression accelerator unit receives a data stream that includes codewords, where the codewords represent a literal value, length value, and a distance value, as a few examples. In particular, a literal value may represent a string of one or more symbols (e.g., alphanumeric characters), while the length and distance values may form a length/distance pair, representing a number of characters to be copied starting from a position of a symbol that is the distance value away from the current position. The literal type, length type, and distance type are examples of codeword types. In one or more example techniques described in this disclosure, a decoder circuit of the data compression/decompression accelerator unit identifies valid codewords from the data stream based on a combination of the codeword type and location of the codeword in the data stream.

In one or more examples, a decoder circuit of the data compression/decompression accelerator includes a plurality of detector circuits that each receive a plurality of bits from a portion of the data stream. Each of the detector circuits may receive a starting bit of its plurality of bits from sequential bit positions in the portion of the data stream. Each of the detector circuits may keep receiving bits from the portion of the data stream starting from their respective starting bits until the detector circuits determine that the plurality of bits received form a codeword. For example, the decoder circuit may store a list of codewords, and after receiving each bit from the portion of the data stream, the detector circuits may compare the received bits to the list of codewords to determine whether received bits, received so far, form a codeword identified in the list of codewords.

The detector circuits may perform such operations in parallel with one other (e.g., at substantially the same time). In this way, one or more of the detector circuits may identify one or more codewords within an input data stream (these identified codewords are potential codewords, and may not be actual valid codewords). The detector circuits operate in parallel starting from sequential bits of the input data stream common to the detector circuits.

The detector circuits performing such operations in parallel should not be considered as limiting the example techniques such that the detector circuits complete respective operations at the same time. A first detector circuit may complete identifying a shorter codeword before a second detector circuit completes identifying a longer codeword.

By identifying codewords from the data stream in parallel, the detector circuits may be configured to identify codewords at a higher throughput than if codewords were identified serially. Serial identification of codewords refers to a decoder circuit identifying codewords one at a time by parsing the data stream. With parallel identification of codewords, a plurality of decoders is identifying multiple codewords from a common data stream at substantially a same time. Hence, more codewords may be identified within a unit of time using the example techniques described in this disclosure as compared to serial identification of codewords.

Moreover, as described in more detail, a second codeword that follows a first codeword may be fused together to form a so-called "super codeword." It may be possible for a selector circuit to, starting from a current decoding point, splice out super codewords and output the super codewords for decoding. In this way, multiple codewords are outputted for decoding, rather than one codeword being outputted for decoding at a time.

While one or more detector circuits may identify codewords, not every codeword may be valid codeword, but is rather a potential codeword. A potential codeword is a codeword that is found in the codeword table. A valid codeword is a codeword that is found in the codeword table, and would have been identified had serial codeword identification processes been used.

As an example, a first detector circuit starts with bit 0 of the data stream portion, and a second detector circuit starts with bit 1 of the data stream portion. In this example, assume that the first detector circuit identifies a first potential codeword, and the second detector circuit identifies a second potential codeword. However, in this example, if serial codeword identification were used, then the bits of the second potential codeword would have actually been part of the first potential codeword. Therefore, under a serial identification process, the second potential codeword would not have been identified. Accordingly, the first potential codeword may be a valid codeword, but the second potential codeword is not a valid codeword.

In one or more examples, a selector circuit may be configured to determine which codewords identified by respective detector circuits are valid codewords. The selector circuit may determine which codewords are valid codewords based on a combination of factors such current decoding position in the bitstream, whether the a codeword is of end type, and number of bits (e.g., length) of the codeword or super codeword (e.g., where a super codeword is one or more codewords fused together). For example, each of the detector circuit may generate type values for the one or more identified codewords. Respective fuser circuits may determine whether the codewords from the detector circuits are combinable based on the type values and position, and fuse together the codewords to form super codewords or output, without fusing, the codewords.

The selector circuit may receive the output from respective fuser circuits. The selector circuit may track the current decoding position and output for super codewords or codewords based on the number of bits in the super codewords or codewords. In outputting, the selector circuit may skip over (e.g., discard) certain super codewords or codewords based on their positions. As one example, assume that a first fuser circuit generated a first super codeword having a size of 10 bits. A second fuser circuit generated a second super codeword having a size of 15 bits. However, the start of the second super codeword is within the first super codeword. In this example, assuming that the current decoding position is the start of the first super codeword, the selector circuit may output the 10 bits of the first super codeword for decoding and may discard the 15 bits of the second super codeword from the second fuser circuit because the second super codeword starts from within the first super codeword, but only the first super codeword includes the valid codewords.

There may be three types of codewords: (1) codewords for literals, called literal type, (2) codewords for length, called length type, and (3) codewords for distance, called distance type. Each of the codeword types may be assigned a numerical range. For instance, codewords of the literal type may be within a range of values A to B, codewords of length type may be within a range of C to D (B and C may be equal or different values), and codewords of distance type may be within a range of E to F (F and D may be equal or different values). Each detector circuit that identified a codeword (e.g., potential codeword) may determine the codeword type by determining the range within which the value resides.

Each detector circuit may output to respective fuser circuits. Each fuser circuit may determine whether the codeword outputted by its respective detector circuit is combinable with the output of another detector circuit based on the respective codeword type and codeword length. For instance, a first detector circuit, starting with a first bit, may determine a first codeword of literal type that is 4 bits long. In this example, a first fuser circuit associated with the first detector circuit may determine the codeword type of the codeword that a fifth detector circuit outputted (e.g., the detector circuit that is processing the fifth bit), and determine whether the codeword determined by the fifth detector circuit has a type that means that it can be combined with the codeword that the first detector circuit determined.

Moreover, in some examples, there may be multiple sets of detector circuits. For instance, a first set of detector circuits may be configured to identify codewords in the L-space (e.g., codewords having the literal type and the length type). A second set of detector circuits may be configured to identify codewords of the distance type. In this way, the example techniques may more quickly identify length/distance codeword pairs for reasons described in more detail below, such as due to overlapping values used to identify a codeword as a distance codeword or literal codeword.

Figure 2:
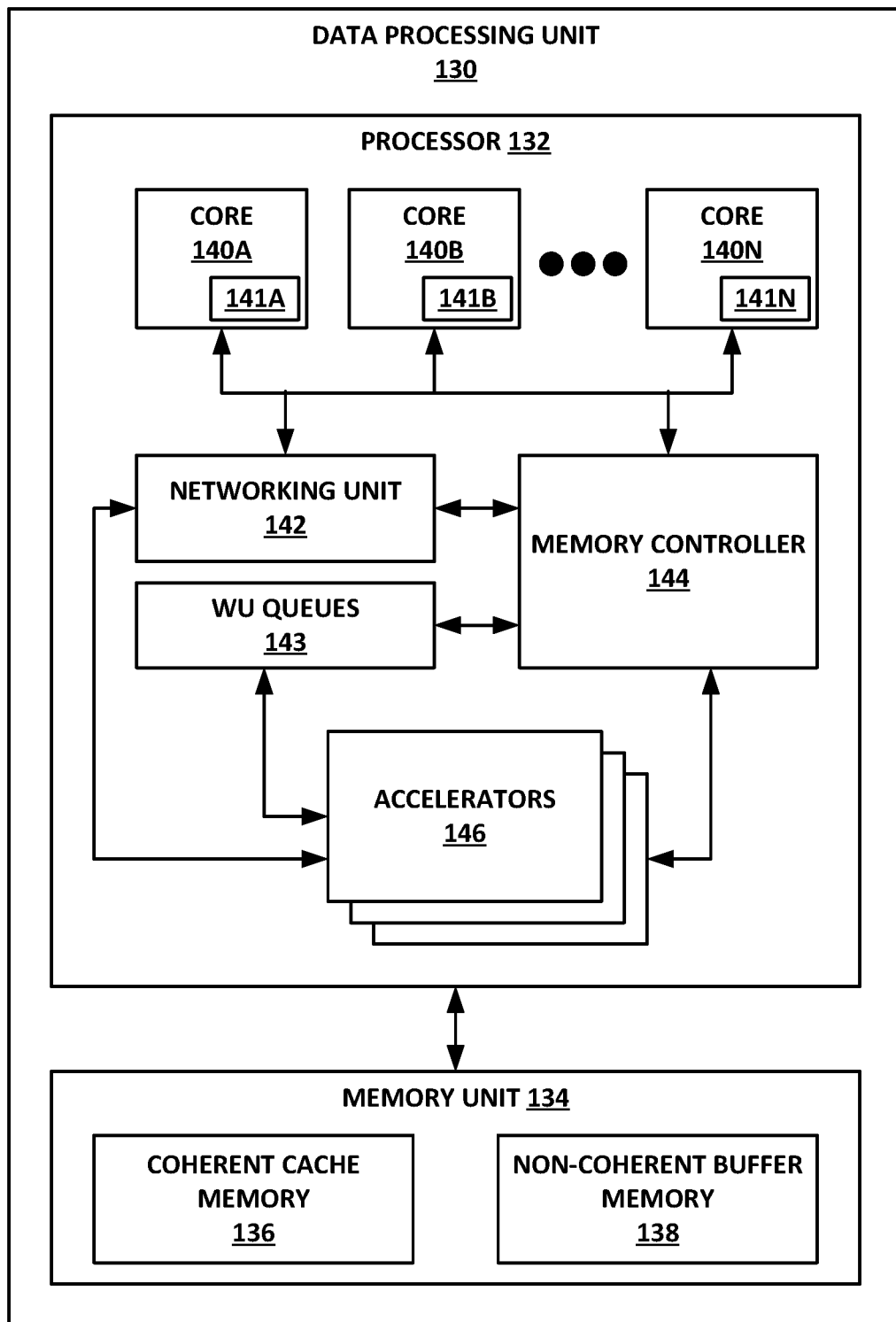
FIG. 2 is a block diagram illustrating an example data processing unit including two or more processing cores, in accordance with the techniques of this disclosure.

FIG. 2 is a block diagram illustrating an example data processing unit (DPU) 130 including two or more processing cores, in accordance with the techniques of this disclosure. DPU 130 generally represents a hardware chip implemented in digital logic circuitry and may be used in any computing or network device. DPU 130 may operate substantially similar to and generally represent any of access nodes 17 of FIG. 1. Thus, DPU 130 may be communicatively coupled to one or more network devices, server devices (e.g., servers 12), random access memory, storage media (e.g., solid state drives (SSDs)), a data center fabric (e.g., switch fabric 14), or the like, e.g., via PCI-e, Ethernet (wired or wireless), or other such communication media. Moreover, DPU 130 may be implemented as one or more application-specific integrated circuit (ASIC), may be configurable to operate as a component of a network appliance or may be integrated with other DPUs within a device.

In the illustrated example of FIG. 2, DPU 130 includes a multi-core processor 132 having a plurality of programmable processing cores 140A-140N ("cores 140") coupled to an on-chip memory unit 134. Each of cores 140 includes a level 1 cache 141 (level 1 caches 141a, 141b, and 141n are associated with cores 140a, 140b, and 140n, respectively).

Memory unit 134 may include two types of memory or memory devices, namely coherent cache memory 136 and non-coherent buffer memory 138. Processor 132 also includes a networking unit 142, work unit (WU) queues 143, a memory controller 144, and accelerators 146. As illustrated in FIG. 2, each of cores 140, networking unit 142, WU queues 143, memory controller 144, memory unit 134, and accelerators 146 are communicatively coupled to each other. In some examples, processor 132 of DPU 130 further includes one or more accelerators (not shown) configured to perform acceleration for various data-processing functions, such as look-ups, matrix multiplication, cryptography, compression, regular expressions, or the like.

In this example, DPU 130 represents a high performance, hyper-converged network, storage, and data processor and input/output hub. For example, networking unit 142 may be configured to receive one or more data packets from and transmit one or more data packets to one or more external devices, e.g., network devices. Networking unit 142 may perform network interface card functionality, packet switching, and the like, and may use large forwarding tables and offer programmability. Networking unit 142 may expose Ethernet ports for connectivity to a network, such as switch fabric 14 of FIG. 1. DPU 130 may also include one or more interfaces for connectivity to host devices (e.g., servers) and data storage devices, e.g., solid state drives (SSDs) via PCIe lanes. DPU 130 may further include one or more high bandwidth interfaces for connectivity to off-chip external memory.

Processor 132 further includes accelerators 146 configured to perform acceleration for various data-processing functions, such as look-ups, matrix multiplication, cryptography, compression, regular expressions, or the like. For example, accelerators 146 may comprise hardware implementations of look-up engines, matrix multipliers, cryptographic engines, compression engines, or the like. In accordance with the techniques of this disclosure, at least one of accelerators 146 represents a hardware implementation of a data decompression engine. In particular, according to the techniques of this disclosure, accelerators 146 include at least one data compression/decompression accelerator that includes a hardware pipeline for performing parallel codeword identification and decoding of codewords in a data stream, as discussed in greater detail below.

Memory controller 144 may control access to on-chip memory unit 134 by cores 140, networking unit 142, and any number of external devices, e.g., network devices, servers, external storage devices, or the like. Memory controller 144 may be configured to perform a number of operations to perform memory management. For example, memory controller 144 may be capable of mapping accesses from one of the cores 140 to either of coherent cache memory 136 or non-coherent buffer memory 138. More details on the bifurcated memory system included in the DPU are available in U.S. Provisional Patent Application No. 62/483,844, filed Apr. 10, 2017, and U.S. patent application Ser. No. 15/949,892, filed Apr. 10, 2018, and titled "Relay Consistent Memory Management in a Multiple Processor System," the entire content of each of which is incorporated herein by reference.

Cores 140 may comprise one or more microprocessors without interlocked pipeline stages (MIPS) cores, advanced reduced instruction set computing (RISC) machine (ARM) cores, performance optimization with enhanced RISC—performance computing (PowerPC) cores, RISC Five (RISC-V) cores, or complex instruction set computing (CISC or x86) cores. Each of cores 140 may be programmed to process one or more events or activities related to a given data packet such as, for example, a networking packet or a storage packet. Each of cores 140 may be programmable using a high-level programming language, e.g., C, C++, or the like.

Each of level 1 caches 141 may include a plurality of cache lines logically or physically divided into cache segments. Each of level 1 caches 141 may be controlled by a load/store unit also included within the core. The load/store unit may include logic for loading data into cache segments and/or cache lines from non-coherent buffer memory 138 and/or memory external to DPU 130. The load/store unit may also include logic for flushing cache segments and/or cache lines to non-coherent buffer memory 138 and/or memory external to DPU 130. In some examples, the load/store unit may be configured to prefetch data from main memory during or after a cache segment or cache line is flushed.

Processor cores 140 may be arranged as processing pipelines, and such processing cores may employ techniques to encourage efficient processing of such work units and high utilization of processing resources. For instance, any of processing cores 140 (or a processing unit within a core) may, in connection with processing a series of work units retrieved from WU queues 143, access data and cache the data into a plurality of segments of level 1 cache 141 associated with the processing core. In some examples, a processing core 140 may process a work unit and cache data from non-coherent memory 138 in a segment of the level 1 cache 141. As described herein, concurrent with execution of work units by cores 140, a load store unit of memory controller 144 may be configured to prefetch, from non-coherent memory 138, data associated with work units within WU queues 143 that are expected to be processed in the future, e.g., the WUs now at the top of the WU queues and next in line to be processed. For each core 140, the load store unit of memory controller 144 may store the prefetched data associated with the WU to be processed by the core into a standby segment of the level 1 cache 141 associated with the processing core 140.

In some examples, the plurality of cores 140 executes instructions for processing a plurality of events related to each data packet of one or more data packets, received by networking unit 142, in a sequential manner in accordance with one or more work units associated with the data packets. As described above, work units are sets of data exchanged between cores 140 and networking unit 142 where each work unit may represent one or more of the events related to a given data packet.

As one example use case, stream processing may be divided into work units executed at a number of intermediate processors between source and destination. Depending on the amount of work to be performed at each stage, the number and type of intermediate processors that are involved may vary. In processing a plurality of events related to each data packet, a first one of the plurality of cores 140, e.g., core 140A may process a first event of the plurality of events. Moreover, first core 140A may provide to a second one of plurality of cores 140, e.g., core 140B a first work unit of the one or more work units. Furthermore, second core 140B may process a second event of the plurality of events in response to receiving the first work unit from first core 140B.

As another example use case, transfer of ownership of a memory buffer between processing cores may be mediated by a work unit message delivered to one or more of processing cores 140. For example, the work unit message may be a four-word message including a pointer to a memory buffer. The first word may be a header containing information necessary for message delivery and information used for work unit execution, such as a pointer to a function for execution by a specified one of processing cores 140. Other words in the work unit message may contain parameters to be passed to the function call, such as pointers to data in memory, parameter values, or other information used in executing the work unit.

In one example, receiving a work unit is signaled by receiving a message in a work unit receive queue (e.g., one of WU queues 143). The one of WU queues 143 is associated with a processing element, such as one of cores 140, and is addressable in the header of the work unit message. One of cores 140 may generate a work unit message by executing stored instructions to addresses mapped to a work unit transmit queue (e.g., another one of WU queues 143). The stored instructions write the contents of the message to the queue. The release of a work unit message may be interlocked with (gated by) flushing of the core's dirty cache data and in some examples, prefetching into the cache of data associated with another work unit for future processing.

Figure 3:
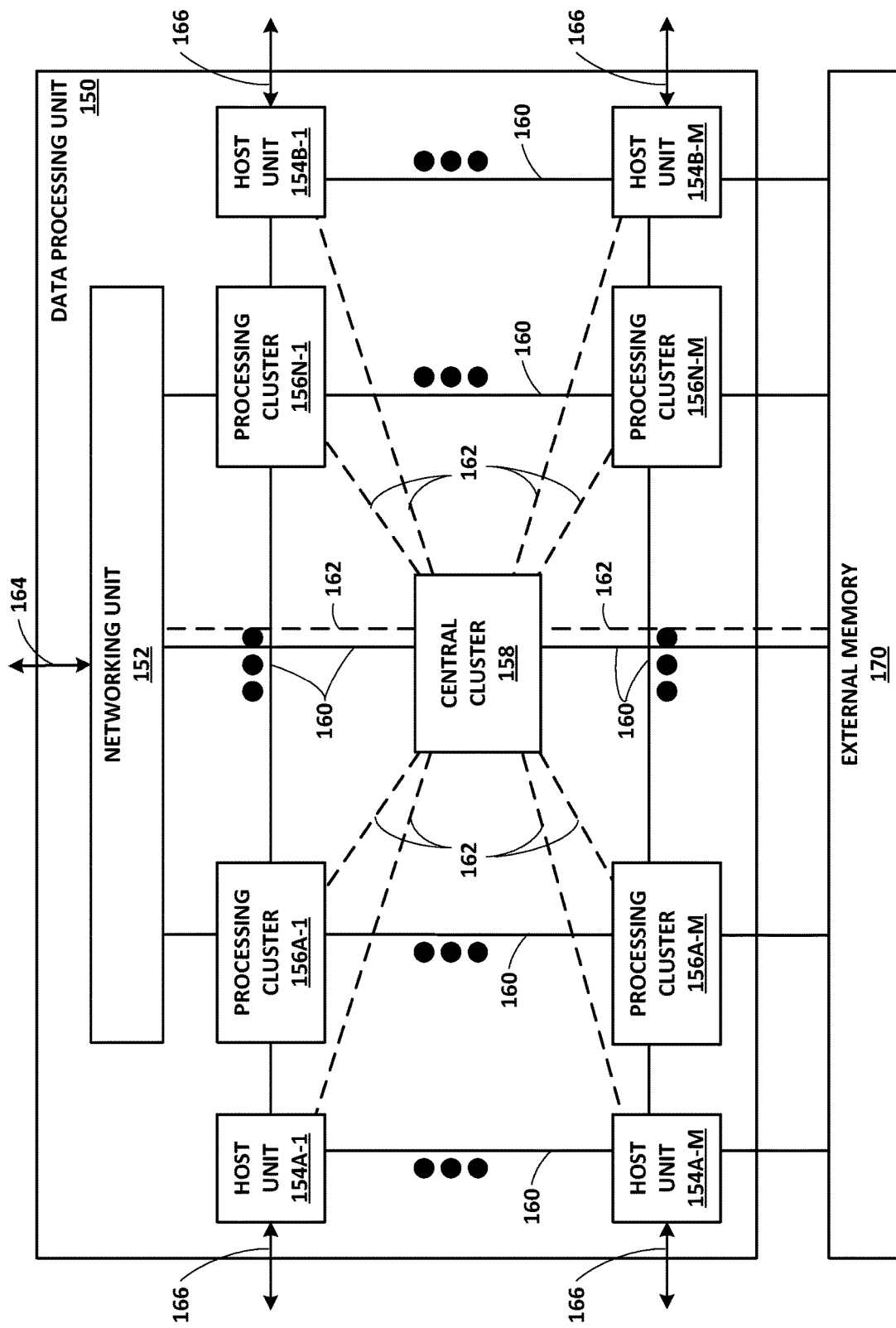
FIG. 3 is a block diagram illustrating another example data processing unit including two or more processing clusters, in accordance with the techniques of this disclosure.

FIG. 3 is a block diagram illustrating another example of a DPU 150 including two or more processing clusters, in accordance with the techniques of this disclosure. DPU 150 may operate substantially similar to any of the access nodes 17 of FIG. 1. Thus, DPU 150 may be communicatively coupled to a data center fabric (e.g., switch fabric 14), one or more server devices (e.g., servers 12), storage media (e.g., SSDs), one or more network devices, random access memory, or the like, e.g., via PCI-e, Ethernet (wired or wireless), or other such communication media in order to interconnect each of these various elements. DPU 150 generally represents a hardware chip implemented in digital logic circuitry. As various examples, DPU 150 may be provided as an integrated circuit mounted on a motherboard of a computing, networking and/or storage device or installed on a card connected to the motherboard of the device.

In general, DPU 150 represents a high performance, hyper-converged network, storage, and data processor and input/output hub. As illustrated in FIG. 3, DPU 150 includes networking unit 152, processing clusters 156A-1 to 156N-M (processing clusters 156), host units 154A-1 to 154B-M (host units 154), and central cluster 158, and is coupled to external memory 170. Each of host units 154, processing clusters 156, central cluster 158, and networking unit 152 may include a plurality of processing cores, e.g., MIPS cores, ARM cores, PowerPC cores, RISC-V cores, or CISC or x86 cores. External memory 170 may comprise random access memory (RAM) or dynamic random access memory (DRAM).

As shown in FIG. 3, host units 154, processing clusters 156, central cluster 158, networking unit 152, and external memory 170 are communicatively interconnected via one or more specialized network-on-chip fabrics. A set of direct links 162 (represented as dashed lines in FIG. 3) forms a signaling network fabric that directly connects central cluster 158 to each of the other components of DPU 150, that is, host units 154, processing clusters 156, networking unit 152, and external memory 170. A set of grid links 160 (represented as solid lines in FIG. 3) forms a data network fabric that connects neighboring components (including host units 154, processing clusters 156, networking unit 152, and external memory 170) to each other in a two-dimensional grid.

Networking unit 152 has Ethernet interfaces 164 to connect to the switch fabric, and interfaces to the data network formed by grid links 160 and the signaling network formed by direct links 162. Networking unit 152 provides a Layer 3 (i.e., OSI networking model Layer 3) switch forwarding path, as well as network interface card (NIC) assistance. One or more hardware direct memory access (DMA) engine instances (not shown) may be attached to the data network ports of networking unit 152, which are coupled to respective grid links 160. The DMA engines of networking unit 152 are configured to fetch packet data for transmission. The packet data may be in on-chip or off-chip buffer memory (e.g., within buffer memory of one of processing clusters 156 or external memory 170), or in host memory.

Host units 154 each have PCI-e interfaces 166 to connect to servers and/or storage devices, such as SSD devices. This allows DPU 150 to operate as an endpoint or as a root. For example, DPU 150 may connect to a host system (e.g., a server) as an endpoint device, and DPU 150 may connect as a root to endpoint devices (e.g., SSD devices). Each of host units 154 may also include a respective hardware DMA engine (not shown). Each DMA engine is configured to fetch data and buffer descriptors from host memory, and to deliver data and completions to host memory.

DPU 150 provides optimizations for stream processing. DPU 150 executes an operating system that facilitates run-to-completion processing, which may eliminate interrupts, thread scheduling, cache thrashing, and associated costs. For example, an operating system may run on one or more of processing clusters 156. Central cluster 158 may be configured differently from processing clusters 156, which may be referred to as stream processing clusters. In one example, central cluster 158 executes the operating system kernel (e.g., Linux kernel) as a control plane. Processing clusters 156 may function in run-to-completion thread mode of a data plane software stack of the operating system. That is, processing clusters 156 may operate in a tight loop fed by work unit queues associated with each processing core in a cooperative multi-tasking fashion.

DPU 150 operates on work units (WUs) that associate a buffer with an instruction stream to reduce dispatching overhead and allow processing by reference to minimize data movement and copy. The stream-processing model may structure access by multiple processors (e.g., processing clusters 156) to the same data and resources, avoid simultaneous sharing, and therefore, reduce contention. A processor may relinquish control of data referenced by a work unit as the work unit is passed to the next processor in line. Central cluster 158 may include a central dispatch unit responsible for work unit queuing and flow control, work unit and completion notification dispatch, and load balancing and processor selection from among processing cores of processing clusters 156 and/or central cluster 158.

As described above, work units are sets of data exchanged between processing clusters 156, networking unit 152, host units 154, central cluster 158, and external memory 170. Each work unit may be represented by a fixed length data structure, or message, including an action value and one or more arguments. In one example, a work unit message includes four words, a first word having a value representing an action value and three additional words each representing an argument. The action value may be considered a work unit message header containing information necessary for message delivery and information used for work unit execution, such as a work unit handler identifier, and source and destination identifiers of the work unit. The other arguments of the work unit data structure may include a frame argument having a value acting as a pointer to a continuation work unit to invoke a subsequent work unit handler, a flow argument having a value acting as a pointer to state that is relevant to the work unit handler, and a packet argument having a value acting as a packet pointer for packet and/or block processing handlers.

In some examples, one or more processing cores of processing clusters 180 may be configured to execute program instructions using a work unit (WU) stack. In general, a work unit (WU) stack is a data structure to help manage event driven, run-to-completion programming model of an operating system typically executed by processing clusters 156 of DPU 150, as further described in U.S. Patent Application Ser. No. 62/589,427, filed Nov. 21, 2017, the entire content of which is incorporated herein by reference.

In some example implementations, load store units within processing clusters 156 may, concurrent with execution of work units by cores within the processing clusters, identify work units that are enqueued in WU queues for future processing by the cores. In some examples, WU queues storing work units enqueued for processing by the cores within processing clusters 156 may be maintained as hardware queues centrally managed by central cluster 158. In such examples, load store units may interact with central cluster 158 to identify future work units to be executed by the cores within the processing clusters. The load store units prefetch, from the non-coherent memory portion of external memory 170, data associated with the future work units. For each core within processing clusters 156, the load store units of the core may store the prefetched data associated with the WU to be processed by the core into a standby segment of the level 1 cache associated with the processing core.

DPU 150 may include one or more accelerators for performing data decompression of a data stream received and stored in memory of DPU 150. As described in more detail, the accelerators of DPU 150 include one or more detector circuits that are configured to operate in parallel to identify codewords from the input data stream. For instance, each of the detector circuits receives a starting bit from a portion of the data stream. The starting bit for each of the detector circuits is a sequential bit from the data stream. The detector circuits may determine whether its received bits form a codeword. In this way, one or more detector circuits may identify codewords from the data stream portion in parallel, rather than serially.

In some examples, fuser circuits may be configured to fuse together codewords based on the type of codewords to generate so-called super codewords. For example, fuser circuits may combine (e.g., fuse) a length type codeword with a distance type codeword, assuming that the distance type codeword occurred immediately after the length type codeword. Fuser circuits may combine two codewords of a literal type, assuming that the two codewords follow one another sequentially.

However, not all identified codewords or super codewords may be valid codewords. For example, it is possible that a first super codeword starts from within a second super codeword based on how the respective fuser circuits fused together codewords. Accordingly, only either the first super codeword or the second super codeword includes codewords that are valid codewords. For instance, if there was serial decoding of codewords, a serial decoder would have only identified either the codewords of the first super codeword or the codewords of the second super codeword.

A selector circuit may track a current decoding position. If the current decoding position is at the beginning of the first super codeword, then the selector circuit may output the codewords of the first super codeword, and discard the second super codeword (e.g., the codewords of the first super codewords are valid and the codewords of the second super codeword are not valid). If the current decoding position is at the beginning of the second super codeword, then the selector circuit may output the codewords of the second super codeword, and discard the first super codeword (e.g., the codewords of the second super codewords are valid and the codewords of the first super codeword are not valid).

The accelerators of DPU 150 may include decoder pipeline circuits to decode the valid codewords. In this way, the accelerators may decode a plurality of codewords in the data stream (e.g., by identifying super codewords), allowing for a higher throughput.

Figure 4:
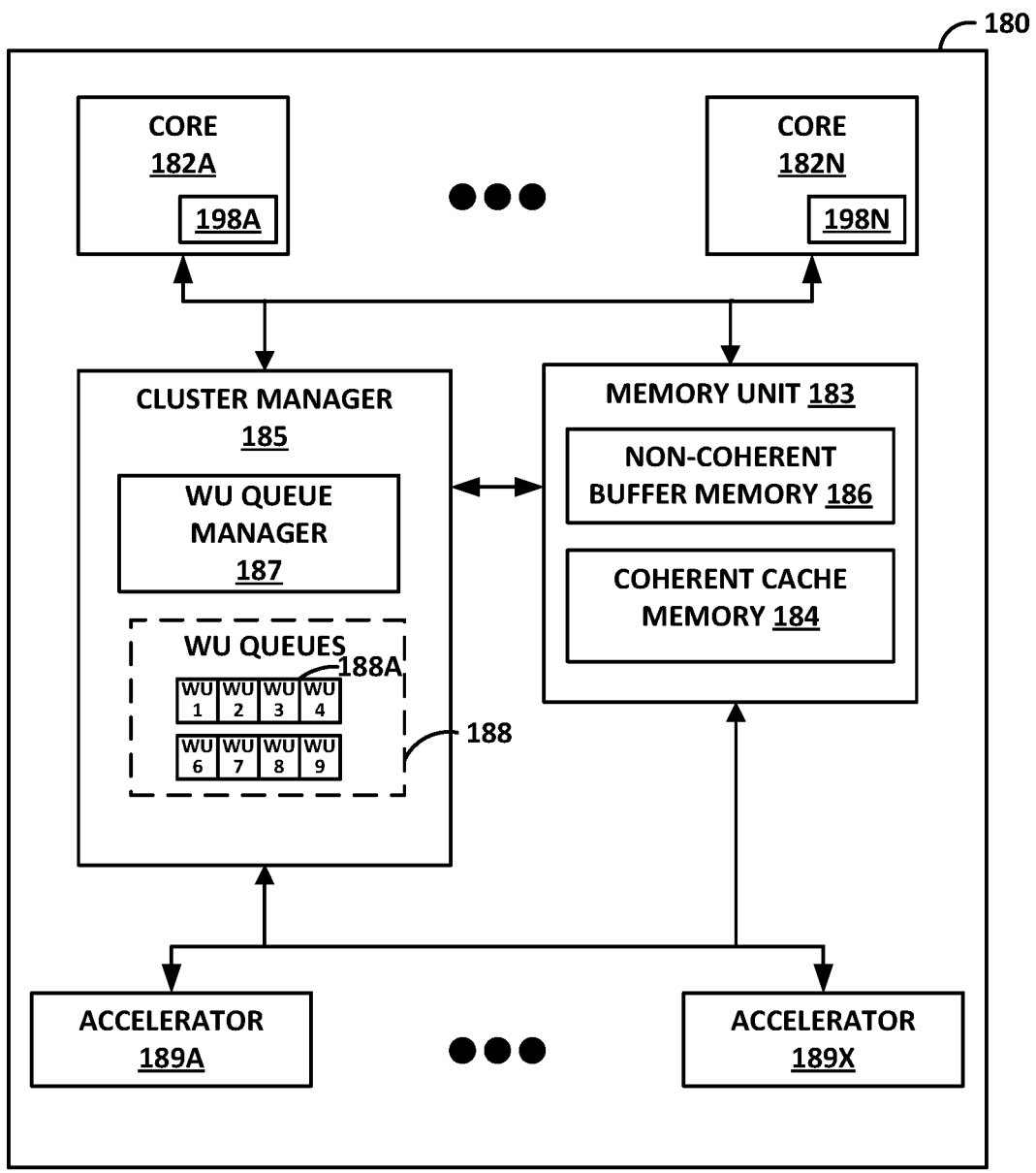
FIG. 4 is a block diagram illustrating an example processing cluster including two or more processing cores.

FIG. 4 is a block diagram illustrating an example processing cluster 180 including two or more processing cores 182A-182N. Each of processing clusters 156 of DPU 150 of FIG. 3 may be configured in a manner substantially similar to that shown in FIG. 4. In the example of FIG. 4, processing cluster 180 includes cores 182A-182N ("cores 182"), a memory unit 183 including a coherent cache memory 184 and a non-coherent buffer memory 186, a cluster manager 185 including WU queue manager 187 for maintaining (e.g., within hardware registers of processing cluster 180) and manipulating WU queues 188, and accelerators 189A-189X ("accelerators 189"). Each of cores 182 includes L1 buffer cache 198 (i.e., core 182 includes L1 buffer cache 198A and in general, core 182N includes L1 buffer cache 198N). In some examples, cluster manager 185 is alternatively located within central cluster 158, and/or WU queues 188 are alternatively maintained within central cluster 158 (e.g., within hardware registers of central cluster 158).

An access node or DPU (such as access nodes 17 of FIG. 1, DPU 130 of FIG. 2, or DPU 150 of FIG. 3) may support two distinct memory systems: a coherent memory system and a non-coherent buffer memory system. In the example of FIG. 4, coherent cache memory 184 represents part of the coherent memory system while non-coherent buffer memory 186 represents part of the non-coherent buffer memory system. Cores 182 may represent the processing cores discussed with respect to DPU 150 of FIG. 3. Cores 182 may share non-coherent buffer memory 186. As one example, cores 182 may use non-coherent buffer memory 186 for sharing streaming data, such as network packets.

In general, accelerators 189 perform acceleration for various data-processing functions, such as table lookups, matrix multiplication, cryptography, compression/decompression, regular expressions, or the like. That is, accelerators 189 may comprise hardware implementations of lookup engines, matrix multipliers, cryptographic engines, compression/decompression engines, regular expression interpreters, or the like. For example, accelerators 189 may include a lookup engine that performs hash table lookups in hardware to provide a high lookup rate. The lookup engine may be invoked through work units from external interfaces and virtual processors of cores 182, and generates lookup notifications through work units. Accelerators 189 may also include one or more cryptographic units to support various cryptographic processes. Accelerators 189 may also include one or more compression/decompression units to perform compression and/or decompression.

An example process by which a processing cluster 180 processes a work unit is described here. Initially, cluster manager 185 of processing cluster 180 may queue a work unit (WU) in a hardware queue of WU queues 188. When cluster manager 185 "pops" the work unit from the hardware queue of WU queues 188, cluster manager 185 delivers the work unit to one of accelerators 189, e.g., a lookup engine. The accelerator 189 to which the work unit is delivered processes the work unit and determines that the work unit is to be delivered to one of cores 182 (in particular, core 182A, in this example) of processing cluster 180. Thus, the one of accelerators 189 forwards the work unit to a local switch of the signaling network on the DPU, which forwards the work unit to be queued in a virtual processor queue of WU queues 188.

As noted above, in accordance with the techniques of this disclosure, one or more of accelerators 189 may be configured to perform data decompression. A data compression/decompression unit of accelerators 189, in accordance with the techniques of this disclosure, may include circuitry for performing parallel decoding of codewords within an input data stream. The codewords may be generated from a prefix-free, variable length encoding process, and therefore, the length of each codeword may be variable. Due to the variable length of the codewords, one or more of accelerators 189 may not be configured to determine, prior to actually decoding codewords, where the codewords are demarcated.

In one or more examples, the data compression/decompression unit of accelerators 189 include a plurality of detector circuits that each determine whether a plurality of bits forms a codeword, where each detector circuits receives sequential bits as starting bits of the its respective plurality of bits. Not all of the codewords identified by the detector circuits are necessarily valid codewords (e.g., codewords that otherwise would not have identified under a serial processing scheme). For example, an identified codeword may be in a position or may be of a type that would not be consistent with a data stream that is compliant with the encoding described in this disclosure. A selector circuit may determine which of the detector circuits identified codewords that are a valid combination of position and type values, and decoder pipeline circuits may decode the codewords having the valid combination of position and type values to reconstruct symbol values of an input data file.

After cluster manager 185 pops the work unit from the virtual processor queue of WU queues 188, cluster manager 185 delivers the work unit via a core interface to core 182A, in this example. An interface unit of core 182A then delivers the work unit to one of the virtual processors of core 182A.

Core 182A processes the work unit, which may involve accessing data, such as a network packet or storage packet, in non-coherent memory 156A and/or external memory 170. Core 182A may first look for the corresponding data in cache 198A, and in the event of a cache miss, may access the data from non-coherent memory 156A and/or external memory 170. In some examples, while processing the work unit, core 182A may store information (i.e., the network packet or data packet) associated with the work unit in an active segment of cache 198A. Further, core 182A may, while processing the work unit, prefetch data associated with a second work unit into a different, standby segment of cache 198A. When core 182A completes processing of the work unit, core 182A initiates (or causes initiation of) a cache flush for the active segment, and may also initiate prefetching of data associated with a third work unit (to be processed later) into that active segment. Core 182A (or a virtual processor within core 182A) may then swap the active segment and the standby segment so that the previous standby segment becomes the active segment for processing of the next work unit (i.e., the second work unit). Because data associated with the second work unit was prefetched into this now active segment, core 182A (or a virtual processor within core 182A) may be able to more efficiently process the second work unit. Core 182A then outputs corresponding results (possibly including one or more work unit messages) from performance of the work unit back through the interface unit of core 182A.

In some example implementations, load store units within memory unit 183 may, concurrent with execution of work units by cores 182 within the processing cluster 180, identify work units that are enqueued in WU queues 188 for future processing by the cores. The load store units prefetch, from a non-coherent memory portion of external memory 170, data associated with the future work units and store the prefetched data associated with the WUs to be processed by the cores into a standby segment of the level 1 cache associated with the particular processing cores.

Figure 5:
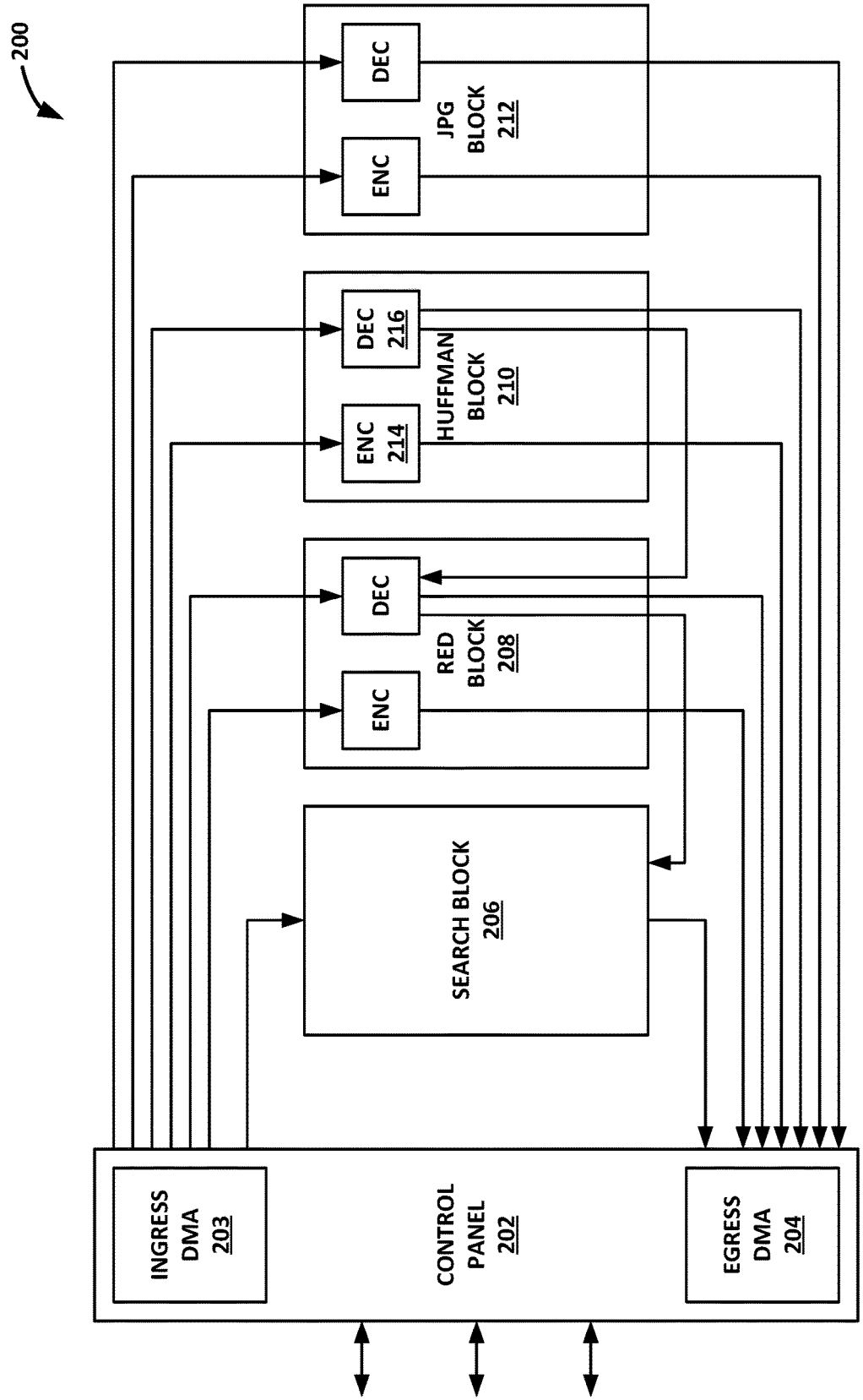
FIG. 5 is a block diagram illustrating an example data compression/decompression accelerator.

FIG. 5 is a block diagram illustrating an example data compression/decompression accelerator 200. For example, data compression/decompression accelerator 200 may be one or more of accelerators 146 of data processing unit 130 from FIG. 2, or one or more of accelerators 189 of processing cluster 180 from FIG. 4. In some examples, data compression/decompression accelerator 200 may be included in each of processing clusters 156 of data processing unit 150 from FIG. 3.

Data compression/decompression accelerator 200 is configured to accelerate the computationally intensive data compression and decompression operations conventionally performed by software running on a general purpose processor. As illustrated in FIG. 5, data compression/decompression accelerator 200 includes a control panel 202, a search block 206, a range encode/decode (RED) block 208, a Huffman encode/decode block 210, and a JPG re-encode/decode block 212. With these components, as described in more detail below, data compression/decompression accelerator 200 may support DEFLATE compression and decompression used by gzip and zlib, support Lempel-Ziv-Markov chain algorithm (LZMA) compression and decompression, and support JPG re-compression and decompression.

DEFLATE compression comprises a lossless data compression algorithm that uses a combination of a dictionary-based compression scheme performed by search block 206 and Huffman encoding performed by Huffman block 210. For example, the dictionary-based compression scheme may comprise one of the LZ77, LZ78, LZW, LZ4, LZO, or LZS algorithms. The DEFLATE compression and decompression is described in more detail in P. Deutsch, "DEFLATE Compressed Data Format Specification version 1.3," IETF Network Working Group, RFC 1951, May 1996. LZMA compression comprises another lossless data compression algorithm that uses a combination of a dictionary-based compression scheme performed by search block 206 and range encoding performed by RED block 208. JPG re-compression comprises lossy compression for digital images performed by JPG block 212.

Control panel (CP) 202 of data compression/decompression accelerator 200 operates as an interface to the other blocks in data compression/decompression accelerator 200, and is the only block in data compression/decompression accelerator 200 with external interfaces. CP 202 controls the mode of operation, manages WUs, and tracks resources and schedules jobs to the engine blocks (i.e., search block 206, RED block 208, Huffman block 210, and JPG block 212) within data compression/decompression accelerator 200. CP 202 also provides ingress DMA 203 and egress DMA 204. The engine blocks within data compression/decompression accelerator 200 work on a stream of data and there are no random accesses to external memories or to external blocks. External interfaces of CP 202 are used for receiving WUs, sending WUs, receiving payload data, sending result data, and receiving configuration data. Internal interfaces between the engine blocks within data compression/decompression accelerator 200 are mostly streaming interfaces. The internal interfaces may use credit-based flow control. For example, at the beginning of a job there may be N flow control units (flits') of header data that describe the job.

CP 202 is responsible for controlling access to shared resources that can be used by multiple of the engine blocks within data compression/decompression accelerator 200. Any scheduling of resources local to a specific one of the engine blocks may be done locally by that engine block. For example, search block 206 and RED block 208 may share a history buffer local to search block 206. As another example, RED block 208 and Huffman block 210 may share one or more history buffers local to RED block 208. Certain WUs may depend on one or more of the shared resources. As such, CP 202 may control the resource assignment and only schedule WUs that do not conflict with the current resource assignment. The engine blocks within data compression/decompression accelerator 200 may not be able to detect or resolve shared resource conflicts themselves. In addition, several of the engine blocks within data compression/decompression accelerator 200, e.g., search block 206, RED block 208, and Huffman block 210, may have multiple threads. Some of the engine blocks, e.g., at least search block 206, may have both a single thread mode and a multi thread mode, depending on the type of job being processed.

Search block 206 may be the first stage of a two-stage compression process performed by data compression/decompression accelerator 200. For example, search block 206 may be configured to perform a dictionary-based compression algorithm (e.g., the LZ77 algorithm or variants thereof) to search for and replace repeated occurrences of strings of bytes in an input data file. Search block 206 uses a local a history buffer that includes previously seen data as the dictionary for the compression algorithm. Search block 206 is configured to scan the input data file for repeated strings within a history window, and replace the repeated strings with length-distance pairs that point to previous occurrences of the strings. The output of search block 206 includes one or both of literals (i.e., strings of bytes) and length-distance pairs used to replace repeated strings of bytes. The output of search block 206 may then goes through a second stage of compression using entropy encoding, either using Huffman encoding performed by Huffman block 210 or range encoding performed by RED block 208.

The dictionary-based decompression operation involves expanding the length-distance pairs into strings of bytes based on a history buffer. For example, the dictionary-based decompression operation may be performed by RED block 208 since the latency of the decompression operation affects the throughput of search block 206. In the case where the history buffer for the dictionary-based decompression operation is small (e.g., less than or equal to 64 KB), RED block 208 may use a history buffer that is local to RED block 208. In the case where the history buffer for the dictionary-based decompression operation is large (e.g., greater than 64 KB), RED block 208 may use its local buffer as a cache and use the history buffer at search block 206 for up to the maximum supported history buffer size, e.g., 256 KB. When RED block 208 uses the history buffer at search block 206, search block 206 may be disabled. Therefore, the dictionary-based encode/decode operation using a small history buffer may be full duplex, and the dictionary-based encode/decode operation using a large history buffer is half duplex.

Following the dictionary-based compression (e.g., the LZ77 algorithm) performed by search block 206, the encode (ENC) portion of Huffman block 210 may perform the second stage of the two-stage compression process for DEFLATE compression used by gzip and zlib. The output of search block 206 is the input to the encode portion of Huffman block 210. The encode portion (e.g., encoder circuit 214) of Huffman block 210 performs Huffman encoding, which is a type of entropy encoding that replaces high frequency symbols with shorter codewords and low frequency symbols with longer codewords. As a first step, encoder circuit 214 of Huffman block 210 gathers a frequency histogram for every symbol in a block of data, and stores the data in a buffer as the statistics are counted. As a second step, encoder circuit 214 of Huffman block 210 assigns codewords based on the frequency of each symbol. In parallel with this step, the next block of data arrives in a second buffer. As a third step, encoder circuit 214 of Huffman block 210 outputs the encoding table (e.g., codeword table), which also gets compressed. As a fourth step, encoder circuit 214 of Huffman block 210 outputs the encoded data. As the buffer is being drained, the next block begins filling the buffer. There are two buffers per thread. In some examples, Huffman block 210 has two threads such that there are a total of four buffers.

The decode (DEC) portion (e.g., decoder circuit 216) of Huffman block 210 may perform a first stage of a decompression process for DEFLATE format compressed data used by gzip and zlib. Decoder circuit 216 of Huffman block 210 decodes a binary data stream of encoded symbols, represented as codewords, and replaces them with the original symbols. The encoded symbols (e.g., the codewords) are of variable length, so the length of the previous codeword determines where the next codeword to be decoded begins in the data stream. This chain of dependencies typically makes fast decoding challenging. The output of decoder circuit 216 of Huffman block 210 is a sequence of literals and/or length-distance pair symbols. The literals directly represent the original data (i.e., strings of bytes), and the length-distance pairs are pointers to previous occurrences of a string of bytes within a sliding history window. The second stage of the decompression process for DEFLATE is to expand the length-distance pairs. For DEFLATE, the symbol decode and the expansion are independent operations and, therefore, the operations may be performed by separate engine blocks.

In accordance with one or more examples described in this disclosure, decoder circuit 216 may be configured to perform parallel codeword identification from an input data stream. The input data stream includes codewords generated from Huffman encoding of symbols of literals and length-distance pairs. Huffman encoding is described as one example, but the example techniques may be applicable to other types of prefix-free, variable length coding schemes.

As noted above, in variable length coding schemes, such as Huffman coding, the length of the previous codewords determines where the next codeword begins in the data stream. Accordingly, some techniques serially decode the data stream such as identifying a first codeword, then identifying a second codeword that follows the first codeword, and so forth. The variable length characteristic of the codewords creates complication for decoder circuit 216 to determine ahead of time where a codeword ends.

With the techniques described in this disclosure, by performing parallel identification of codewords (e.g., two or more codewords can be identified from the data stream at or approximately at the same time), decoder circuit 216 may be configured to decode more codewords in the same amount of time as compared to serially identification of codewords. For example, decoder circuit 216 may include a plurality of decoder pipeline circuits that can each decode a codeword in parallel. For serial identification of codewords, having plurality of decoder pipeline circuits operating in parallel may be complicated because only one codeword is identified at time.

Figure 7:
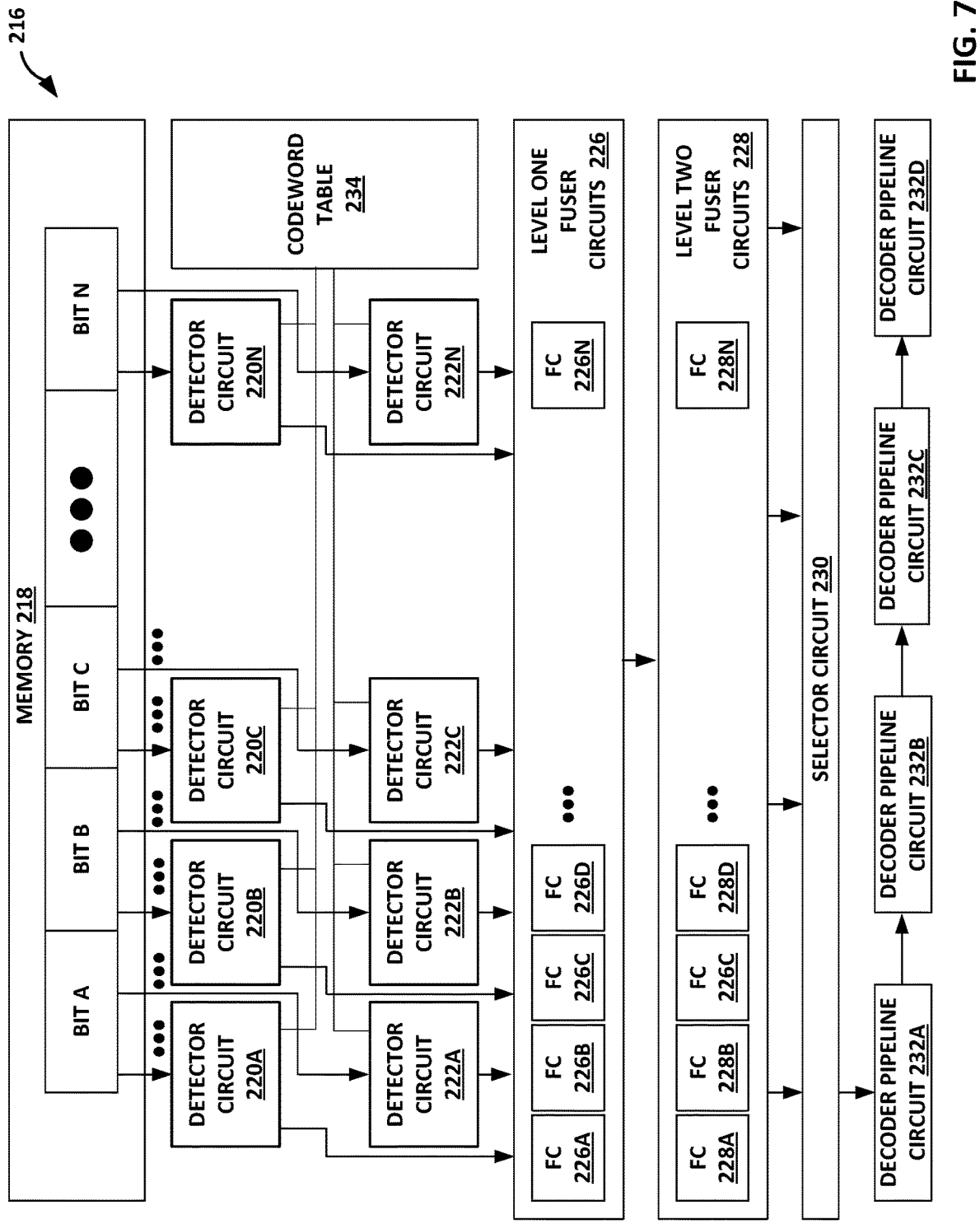
FIG. 7 is a block diagram illustrating an example decoder circuit of FIG. 5 in further detail.

As described in more detail with respect to FIG. 7, to perform the parallel identification of codewords, decoder circuit 216 includes a plurality of detector circuits that each receive a plurality of bits from a portion of the data stream and determine whether the plurality of bits form a codeword. The starting bit for the plurality of bits for each of the plurality of detector circuits may be sequential bits in the portion of the data stream.

Decoder circuit 216 receives a codeword table, which as described above might be compressed. The codeword table identifies all of the codewords within the data stream, and the corresponding table. For the identification process, each of the detector circuits may compare the bits received by the detector circuits to entries in the codeword table to determine whether the received plurality of bits forms a codeword included in the codeword table.

Once a codeword is identified (e.g., identified from the data stream), decoder circuit 216 may determine whether the codeword meets criteria to be a valid codeword. For instance, just because the codeword, identified from a detector circuit, is identified in the codeword table, it may not follow that this codeword is a valid codeword, but is rather only a potential codeword that needs to be further evaluated to determine whether it is a valid codeword. A valid codeword is a codeword that would have been identified using serially identification processes. For example, the codeword needs to satisfy certain criteria, such as have a position in the data stream and have a type that conforms to requirements of the gzip or zlib.

As one example, codeword for a length (e.g., codeword of length type) must be followed by a codeword for a distance (e.g., codeword of distance type). A codeword for a literal (e.g., codeword of literal type) can follow a codeword for a literal type, but a codeword for a distance type cannot follow a codeword for a literal type.

In one or more examples, the detector circuits may generate type values for the identified codewords. The type values indicate the codeword type (e.g., literal, length, or distance). The detector circuits may generate the type values based on numerical value of an identified codeword. For instance, each of the codeword types may be assigned different value ranges, based on the numerical value of an identified codeword, the detector circuits may determine the codeword type (e.g., by determining within which value range the codeword value resides, and the codeword type assigned to that value range).

Although not necessary, the detector circuits may also generate position values. The position values include information indicating the location of a starting bit of an identified codeword in the data stream portion. The position values may also include information indicating the location of a last bit of an identified codeword in the data stream portion. Alternatively or additionally, each detector circuit may include information indicating a size of the codeword (e.g., the number of bits in the codeword). For instance, the position of the starting bit plus the size of the codeword equals the position of the last bit in the data stream portion. Therefore, position of a codeword can be determined from the position of the starting and ending bits, from the position of the starting bit and the size, or from the position of the ending bit and the size (e.g., by subtracting the size from the position of the ending bit to determine the starting bit). In this disclosure, the position values are used generically to encompass the various ways in which the position of a codeword in the data stream portion can be determined (e.g., staring and ending bit positions or starting or ending bit positions and codeword size).

Respective fuser circuits, described in more detail in FIG. 7, may determine which ones of the codewords generated by the detector circuits are combinable based on position and type values. For instance, if a detector circuit identified a codeword of length type that immediately follows another codeword of length type, the fuser circuit may determine that both these codewords do not have a valid combination of position and type values because a length type codeword can only be followed by a distance type codeword, and having two consecutive length type codewords is not allowed in gzip or zlib or LZ77.

Decoder circuit 216 may include a plurality of decoder circuit pipelines that are each configured to decode codewords. The selector circuit may output the codewords having the valid combination of position and type to the decoder circuit pipelines for determining the symbols corresponding to each of the codewords. As one example, the codeword table may include a corresponding symbol for each codeword, and the decoder circuit pipelines may determine the symbol from the codeword table.

RED block 208 performs range encoding and range decoding. The range encode (ENC) portion of RED block 208 is a data stream encoder that compresses one bit at a time. The range encoding algorithm is comparable to arithmetic encoding. The range encode portion of RED block 208 uses a context memory that provides a probability of a 1 or 0 based the current context. The context memory is updated on the fly during compression and that process is precisely mirrored during decompression. In general, range encoding provides higher compression than Huffman encoding at the cost of lower throughput, larger area, and higher complexity.

Following the dictionary-based compression (e.g., the LZ77 algorithm) performed by search block 206, the encode portion of RED block 208 may perform the second stage of the two-stage compression process for LZMA compression. Data compression/decompression accelerator 200 may have two modes of operation for LZMA compression. In a streaming mode, the output of search block 206 is directly sent to RED block 208 using one WU. In some cases, however, there may be a speed mismatch where search block 206 is running faster than RED block 208. To optimize this case, a second mode of operation decouples the search stage from the RED stage using a separate WU for each stage. In the second mode of operation, the intermediate results are directly stored to and accessed from an external memory via ingress DMA 203 and egress DMA 204. In the second mode of operation, RED block 208 may use multiple encoding threads to better match the throughput of search block 206.

The decode (DEC) portion of RED block 208 may perform a first stage of a decompression process for LZMA format compressed data. The decode portion of RED block 208 receives the data to be decoded from ingress DMA 203 and sends the results out over egress DMA 204. Depending on the size of the history buffer used during LZMA compression, RED block 208 may use small internal history buffers, which allows for full duplex encode/decode, or RED block 208 may use a large external history buffer from search block 206, which only allows for half duplex encode/decode. Search block 206 may be disabled when RED block 208 is decoding using the large external history buffer local to search block 206.

Similar to Huffman decoding for DEFLATE, range decoding for LZMA decompression involves decoding symbols and expanding symbols that reference a history buffer. Unlike Huffman decoding, the expansion of the symbols in range decoding may affect the context used to decode the next symbol. In addition to performing range decoding for LZMA decompression, the decode portion of RED block 208 also performs the second stage of Huffman decoding for DEFLATE, i.e., the length-distance pair expansion. In this case, the decode portion of RED block 208 receives the input from Huffman block 210, and generates the final result that is sent out over egress DMA 204.

JPG block 212 may losslessly re-encode jpg files into a proprietary format. Standard jpg files may be compressed in two phases, first a lossy phase and then second a lossless phase using Huffman encoding. JPG block 212 is configured to replace the lossless phase with a more advanced compression algorithm. Similar to RED block 208, JPG block 212 uses an adaptive context-based bit-wise encoder, but it has been specifically optimized for image data. JPG block 212 performs compression and decompression of image data independently from the other engine blocks within data compression/decompression accelerator 200 and is only in communication with CP 202.

Figure 6B:
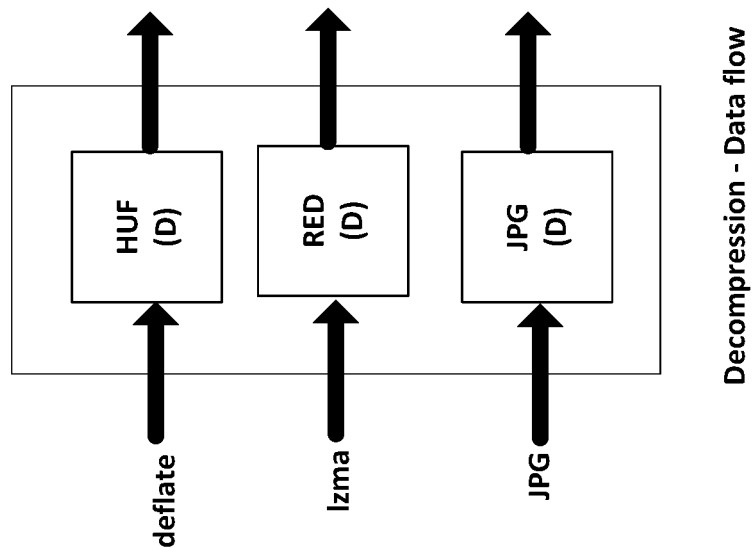
FIGS. 6A and 6B are conceptual diagrams illustrating example data flows through engine blocks within a data compression/decompression accelerator of FIG. 5.
Figure 6A:
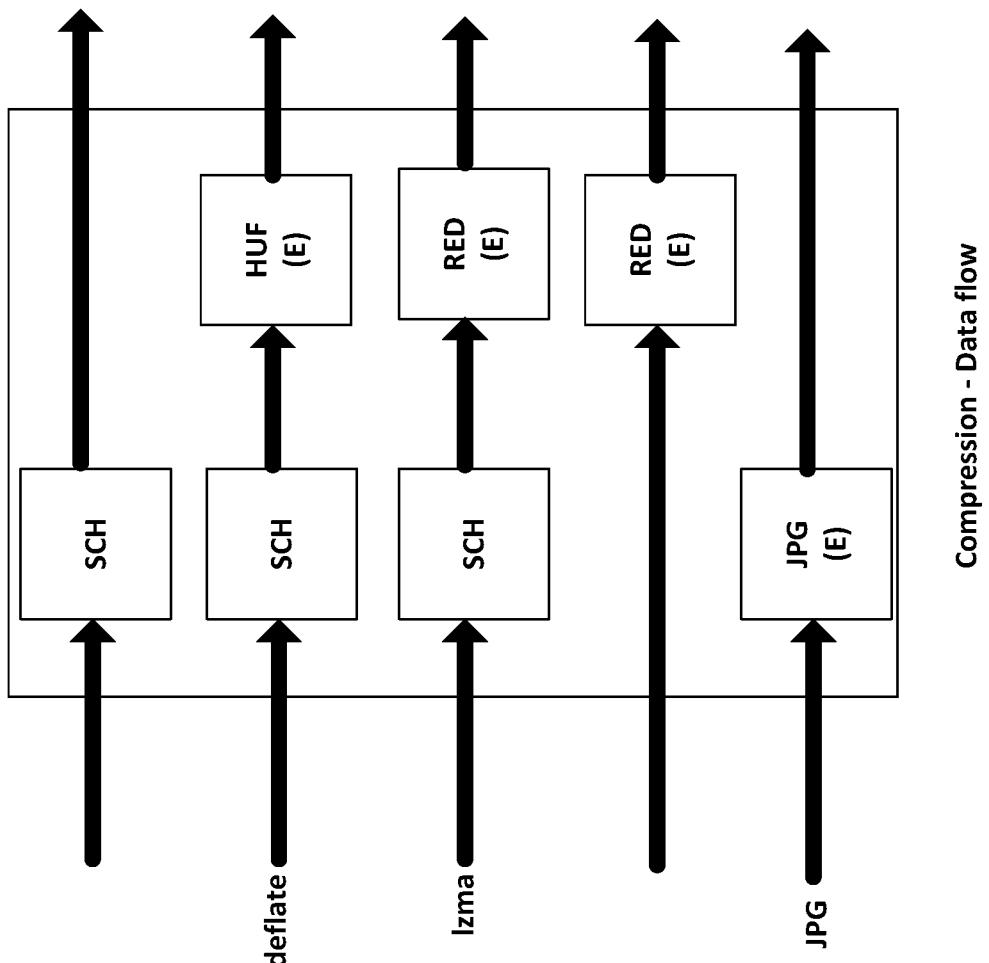

FIGS. 6A and 6B are conceptual diagrams illustrating example data flows through engine blocks within data compression/decompression accelerator 200 of FIG. 5. FIG. 6A illustrates example compression data flows. As illustrated in FIG. 6A, data compression/decompression accelerator 200 may perform dictionary-based compression alone using only search block 206, DEFLATE compression using a combination of search block 206 and the encode portion of Huffman block 210, LZMA compression using a combination of search block 206 and the encode portion of RED block 208, range encoding alone using RED block 208, or JPG re-compression using JPG block 212. FIG. 6B illustrates example decompression data flows. As illustrated in FIG. 6B, data compression/decompression accelerator 200 may perform the first stage of DEFLATE decompression using the decode portion of Huffman block 210, the first stage of LZMA decompression using the decode portion of RED block 208, or JPG decompression using JPG block 212. In the case of both DEFLATE and LZMA decompression, RED block 208 may perform the second stage of decompression, i.e., length-distance pair expansion.

FIG. 7 is a block diagram illustrating an example decoder circuit 216 of FIG. 5 in further detail. As illustrated, decoder circuit 216 includes memory 218, a first set of plurality of detector circuits 220A-220N (collectively "detector circuits 220"), a second set of plurality of detector circuits 222A-222N (collectively "detector circuits 222"), level one fuser circuits 226 including fuser circuits 226A-226N, selector circuit 230, plurality of decoder pipeline circuits 232A-232D (collectively "decoder pipeline circuits 228"), and codeword table 234.

In the example of FIG. 7, decoder circuit 216 also includes level two fuser circuits 228 including fuser circuits 228A-228N. As described in more detail, level two fuser circuits 228 may not be necessary in every example. Also, there may be multiple levels (e.g., in addition to the level two fuser circuits 228) in some examples.

Although not illustrated, codeword table 234 may be part of memory of decoder circuit 216. The memory that stores codeword table 234 may be the same as or different than memory 218.

Memory 218 may include a plurality of registers that each store one bit of a portion of a data stream received by decoder circuit 216. For instance, decoder circuit 216 may include a series of flip-flops that store one bit of a data stream into respective registers of memory 218. In the example illustrated in FIG. 7, there are N-registers in decoder circuit 216, each configured to store one bit, identified as bits A-N. Accordingly, memory 218 may be configured to store N-bit portion of an input data stream. As one example, N equals 32. One example of the input data stream is a flit, and memory 218 may store a portion of a flit.

The number of registers in memory 218 (e.g., the value of N) may be based on various factors. As one example, the number of registers in memory 218 may be based on the maximum size of a codeword. For instance, if the maximum size of a codeword is 10 bits, then in some examples, the number of registers in memory 218 may be greater than 10, and possibly some factor of 10 (e.g., 2× or 3×). The maximum size of a codeword may be predetermined or may be based on reading the codewords in codeword table 234.

Codeword table 234 may store a list of codewords and their corresponding symbols. A core of a DPU, such as those illustrated in FIGS. 2-4, may be configured to read the codewords stored in codeword table 234 and determine the size of the largest codeword. The core may then allocate (e.g., assign) a number of registers in memory 218 based on the size of the largest codeword.

In the example illustrated in FIG. 7, bit A represents the start of the data stream portion, and bit N represents the end of the data stream portion. Each one of detector circuits 220 may be configured to receive a plurality of sequential bits from memory 218, starting from respective bits. For example, detector circuit 220A may be configured to retrieve bits starting from bit A, detector circuit 220B may be configured to retrieve bits starting from bit B, and so forth. The maximum number of bits that any one of detector circuits 220 can retrieve is equal to the maximum size of a codeword. For instance, if the maximum size of a codeword stored in codeword table 234 is 10, then none of detector circuits 220 can retrieve more than 10 bits from memory 218.

Each one of detector circuits 220 may be configured to retrieve bits from memory 218 in parallel. For example, while detector circuit 220A is retrieving bits starting from bit A, detector circuit 220B may be retrieving bits starting from bit B, and so forth. In one or more examples, after every bit that each one of detector circuits 220 retrieves from memory 218, detector circuits 220 may determine whether the bits retrieved so far form a codeword. As one example, each of detector circuits 220 may compare the so-far retrieved bits from memory 218 to codewords in codeword table 234, and determine whether the retrieved bits are the same as a codeword in codeword table 234.

For example, detector circuit 220A may retrieve bit A from memory 218, and determine whether codeword table 234 stores a single bit codeword having the same value as bit A. If codeword table 234 stores a single bit codeword having the same value as bit A, detector circuit 220A may stop retrieving bits. If codeword table 234 does not store a single bit codeword having the same value as bit A, detector circuit 220A may retrieve bit B. If codeword table 234 stores a two-bit codeword having the same value as bit A, bit B, detector circuit 220A may stop retrieving bits. If codeword table 234 does not store a two-bit codeword having the same value as bit A, bit B, detector circuit 220A may retrieve bit C.

Detector circuit 220A may repeat this process until detector circuit 220A identifies a potential codeword from memory 218 (e.g., because detector circuit 220A identified a plurality of bits that form a codeword in codeword table 234). Detector circuit 220B may perform the same operations in parallel with detector circuit 220A, but starting from bit B, detector circuit 220C may perform the same operations in parallel with detector circuits 220A, 220B, but starting from bit C, and so forth.

In some example, rather than going bit-by-bit, detector circuits 220 may be configured to retrieve a minimum number of bits, and then begin the process. For example, assume that the smallest codeword in codeword table 234 is 3 bits. In this example, detector circuit 220A may be configured to retrieve bit A, bit B, and bit C, and then determine whether codeword table 234 stores a three-bit codeword with value bit A, bit B, bit C. If not stored, detector circuit 220A may then retrieve bit D, and repeat the process. In such examples, not all N-detector circuits 220 may be needed. Rather, N minus 2 number of detector circuits 220 may be needed because the minimum size of a codeword is 3 bits, and therefore having detector circuits 220 for N−$1^{st}$ and $N^{th}$ would not serve any purpose. The N−$1^{st}$ detector circuit could only read a maximum of 2 bits, and the $N^{th}$ detector circuit could only read a maximum of 1 bit, but in this example the minimum size of a codeword is 3 bits.

In this manner, detector circuits 220, operating in parallel starting from respective bits of a common input data stream (e.g., data stream portion stored in memory 218) may identify one or more codewords within the input data stream. For instance, detector circuit 220A may, starting from a bit in a first bit position within the input data stream, append sequential bits of the input data stream until forming a first codeword identified in codeword table 234. Detector circuit 220B may, starting from a bit in a second bit position within the input data stream, append sequential bits of the input data stream until forming a second codeword identified in codeword table 234.

In addition to identifying codewords in the input data stream, detector circuits 220 may be configured to determine type values of the identified codeword. To determine the type value of the codeword (also called codeword type), detector circuits 220 may determine a range within which the identified codeword resides. For example, detector circuit 220A identified a codeword having a value within a range of 0 to 225, then detector circuit 220A may determine the type value of the codeword as literal type. If detector circuit 220A identified a codeword having a value of 256, then detector circuit 220A may determine the type value of the codeword as end type. If detector circuit 220A identified a codeword having a value of within range of 257 to 285, then detector circuit 220A may determine the type value of the codeword as length type.

Another codeword type is distance type, and codewords within the range of 0 to 29 may be of the distance type. In this example, there is overlap in the value range for literals and distance (e.g., 0 to 255 for literal type and 0 to 29 for distance type). However, in other examples, each codeword type may be assigned non-overlapping ranges.

Because there is an overlap in the ranges of literal type and distance type, it may be difficult to determine whether a codeword is literal type or a distance type. For instance, if the value was 28 for a codeword, it is unclear if it is distance type because range of distance type is 0 to 29 or literal type because range of literal type is 0 to 255.

As one example way to determine whether a codeword is literal or distance, detector circuits 222 may be configured to identify codewords of the distance type, and detector circuits 220 may be configured to identify codewords of the literal or length type. As illustrated, decoder circuit 216 includes detector circuits 222. Detector circuits 222 are substantially the same (including identical) to detector circuits 220. For instance, detector circuit 222A receives bits, starting from bit A, until detector circuit 222A identifies a codeword in codeword table 234 that is in the distance type range. Detector circuit 222B receives bits, starting from bit B, until detector circuit 222B identifies a codeword in codeword table 234 that is in the distance type range, and so forth.

Each one of detector circuits 220 outputs to level one fuser circuits 226 (also called fuser circuits 226 of level one) information indicative of the type values of the identified codewords. As illustrated, fuser circuits 226 include fuser circuit 226A-226N. Fuser circuit 226A may be configured to determine whether a codeword identified from detector circuit 220A is combinable with codewords identified by other ones of detector circuits 220 or 222 based on the respective type values of the codewords. Fuser circuit 226B may be configured to determine whether a codeword identified from detector circuit 220B is combinable with codewords identified by other ones of detector circuits 220 or 222 based on the respective type values of the codewords, and so forth.

As one example, a codeword of literal type is combinable with another codeword of literal type. As another example, a codeword of length type is combinable with a codeword of distance type. As another example, a codeword of end type is not combinable with any other codeword. In some examples, a codeword of literal type may not be combination with a codeword of length type.

Because each one of fuser circuits 226 may be configured to determine whether codewords identified from respective ones of detector circuits 220 and 222 are combinable, fuser circuits 226 may each receive the codewords and the type values of the codewords from each of detector circuits 220 and 222. Based on the received codeword and type values of the codewords, each one of fuser circuits 226 may be configured to determine whether codewords 226 are combinable.

As one example, assume that fuser circuit 226A received from detector circuit 220A a three-bit codeword having type value of literal. In this example, fuser circuit 226A may determine the output from detector circuit 220D because the first bit for detector circuit 220D is bit D, which is immediately after the last bit of the three-bit codeword identified by detector circuit 220A. If fuser circuit 226A determines that the output from detector circuit 220D is another codeword having type value of literal, then fuser circuit 226A may determine that the codeword identified by detector circuit 220A (e.g., output of detector circuit 220A) is combinable with the codeword identified by detector circuit 220D (e.g., the output of detector circuit 220D). In this example, fuser circuit 226A may combine the codeword outputted by detector circuit 220A with the codeword outputted by detector circuit 220D to form a so-called super codeword. Fuser circuit 226A may output the super codeword for further processing, as described in more detail below.

A super codeword is the result of two or more codewords being combined together. For example, in the above example, the super codeword is a string of bits that includes the bits of the codeword outputted by detector circuit 220A appended with the string of bits that includes the bits of the codeword outputted by detector circuit 220D.

Each one of fuser circuits 226 may perform similar operations. For example, assume that fuser circuit 226B received the output from detector circuit 220B, and that the codeword identified by detector circuit 220B has a type value of end type. Because codewords having the type value of end type are not combinable with any other codeword, fuser circuit 226B may output the codeword having the end type without combining the codeword with any other codeword.

As an additional example, assume that fuser circuit 226C received the output from detector circuit 220C, and that the codeword identified by detector circuit 220C has a type value of length with four-bits. In this example, because a codeword having type value of distance follows a codeword having type value of length and the output of detector circuit 220C is a codeword having type value of distance, fuser circuit 226C may combine the output of detector circuit 220C with the output of detector circuit 222G. In this example, detector circuit 222G will have identified a codeword of the distance type because detector circuits 222 are configured to identify codewords of the distance type. Also, the first bit of the distance type codeword that detector circuit 222G identifies immediately follows the last bit of the length type codeword that detector circuit 220C identified (e.g., detector circuit 220C identified a four-bit codeword, and immediately following the last bit of the four-bit codeword is the codeword that detector circuit 222G identified). For instance, assume that the bits of the four-bit codeword identified by detector circuit 220C are bits C, D, E, F. Therefore, the next bit will be bit G, which is the first bit of the codeword identified by detector circuit 222G.

In this example, fuser circuit 226C combines the codeword outputted by detector circuit 220C with the codeword outputted by detector circuit 222G to generate a super codeword. In this way, fuser circuit 226C generates a length-distance pair of codewords. Fuser circuit 226C outputs the super codeword for further processing.

As another example, as described above, detector circuit 220D outputted a codeword having a type value of literal type. Assume that the size of the codeword (e.g., number of bits of the codeword) is five. In this example, fuser circuit 226D receives the codeword outputted from detector circuit 220D, and because the codeword is of literal type with five bits, fuser circuit 226D determines whether the codeword outputted by detector circuit 220D is combinable with the codeword outputted by detector circuit 220I. In this example, the bits of the codeword outputted by detector circuit 220D are bits D, E, F, G, H, and therefore, the immediately following bit is bit I, which is the first bit in the codeword identified by detector circuit 220I.

Assume that detector circuit 220I determined that the codeword identified by detector circuit 220I has a type value of length type. In some examples, although not necessary in all examples, a codeword of length type may not follow a codeword of literal type. Therefore, in this example, fuser circuit 226D may not combine the codeword outputted by detector circuit 220D with another codeword and may output the codeword for further processing.

As illustrated, fuser circuits 226 of level one output to fuser circuits 228 of level two. However, level two fuser circuits 228 may not be necessary in all examples. Accordingly, the following describes the example with the case where fuser circuits 226 of level one output to selector circuit 230.

Selector circuit 230 may be configured to keep track of where the current decoding position is in the input data stream. For example, each one of fuser circuits 226 output a super codeword or a codeword to selector circuit 230, and selector circuit tracks where to start the decoding in the input data stream.

For instance, using the above example scenario, assume that bit A represents the very start of the input data stream. In this example, selector circuit 230 may start with the output from fuser circuit 226A, which in the above example was a super codeword of two literals. Selector circuit 230 may not be configured to determine the type values, other than if the type value is end type. Selector circuit 230 may be configured to determine the size of the super codewords or codewords that selector circuit 230 receives.

In this example, the super codeword output by fuser circuit 226A is a combination of the three-bit codeword output by detector circuit 220A and the five-bit codeword output by detector circuit 220D forming a super codeword having size of eight-bits. In this example, selector circuit 230 may splice off the eight-bits that form the super codeword in one clock cycle and output the eight-bits for decoding through decoder pipeline 232A-232D. Next, selector circuit 230 may advance to the output of fuser circuit 226I because the super codeword was of size eight-bits. Selector circuit 230 may then repeat this process based on the output of fuser circuit 226I, and splicing off super codewords for processing through decoder pipeline circuit 232A-232D, until selector circuit 230 identifies a codeword having the type value of end type, at which point selector circuit 230 restarts identifying new codewords.

In the above example, selector circuit 230 outputted the super codeword generated by fuser circuit 226A that had a size of eight-bits. However, fuser circuits 226B through 226H may have also outputted super codewords. In this case, selector circuit 230 may discard outputting super codewords or codewords from the output of fuser circuits 226B through 226H (e.g., selector circuit 230 drops the super codewords or codewords from the output of fuser circuits 226B through 226H). This is because these codewords would not have been identified had only serial processing been performed. In other words, if only serial processing were performed, then the three-bit literal codeword followed by the five-bit literal codeword would have been identified, where these codewords correspond to the codewords from detector circuits 220A and 220D. The codewords from detector circuits 220B, 220C, 220E, 220F, 220G, and 220H would not have been found through serial processing. Hence, the outputs from fuser circuits 226B through 226H are discarded by selector circuit 230.

In some examples, as selector circuit 230 is advancing, selector circuit 230 may advance past bit N. To address this issue, selector circuit 230 may utilize the modulo-operation to loop back to the correct bit in memory 218. Memory 218 may be configured to update the bit values accordingly so that memory 218 stores the new bits of the input data stream.

Level two fuser circuits 228 may perform operations similar to fuser circuits 226. However, level two fuser circuits 228 operate on super codewords or codewords that were not combinable. For example, fuser circuit 228A may identify a first super codeword (e.g., outputted by fuser circuit 226A) that is immediately followed by a second super codeword (e.g., outputted by fuser circuit 226I). Fuser circuit 228A may combine the first super codeword with the second super codeword to generate another super codeword of the second level. For instance, the super codewords outputted by fuser circuits 226 may be considered as super codewords of a first level. The super codewords outputted by fuser circuits 226 may be considered as super codewords of a second level, where the super codewords of the second level are formed by combining super codewords or codewords of the first level. Level two fuser circuits 228 output to selector circuit 230, and selector circuit 230 performs operations similar to those described above.

Decoder pipeline circuits 232 may be configured to determine symbol values for the codewords. As one example, one or more of decoder pipeline circuits 232 may receive a codeword or super codeword from selector circuit 230. Decoder pipeline circuits 232 may each determine a symbol corresponding to the codewords. For example, decoder pipeline circuits 232 may parse codeword table 234 and identify the entry of the codeword in codeword table 234. Decoder pipeline circuits 232 may determine the symbol corresponding to the codeword. In some examples, each of decoder pipeline circuits 232 may be configured to output the symbols in a particular order to ensure that symbol ordering is maintained. In some example, a core of a DPU may order the symbols outputted from decoder pipeline circuits 232 to keep the symbol ordering intact.

In one or more examples, decoder pipeline circuit 232A may be configured to receive a super codeword on every cycle. For example, there may be a first-in-first-out (FIFO) memory coupled to the end of decoder pipeline circuit 232D, that is drained by the next component in the decoding process (e.g., decoder or RED block 206, as one example). The FIFO buffer coupled to decoder pipeline circuit 232D allows decoder pipeline circuits 232 to keep performing their operations and storing the resulting data even if the resulting data is not immediately processed. Having the FIFO buffer coupled to decoder pipeline circuit 232D may allow for data to be advanced into memory 218 for processing without needing to wait for the output of decoder pipeline circuits 232 being processed.

In some examples, memory 218 may be a circular FIFO memory. In such an example, a "head of queue" status bit may indicate the current starting bit of memory 218. After decoder pipeline circuits 218 complete their operation, the head of queue status bit is updated to identify the next bit. Also, in the above example, memory 218 is described as outputting one bit after decoder pipeline circuits 232 complete their operations. In some examples, rather than removing a single bit from memory 218, a plurality of bits of memory 218 may be removed, including possibly all bits stored in memory 218. In such examples, a plurality of bits replace the bits removed from memory 218.

Figure 8:
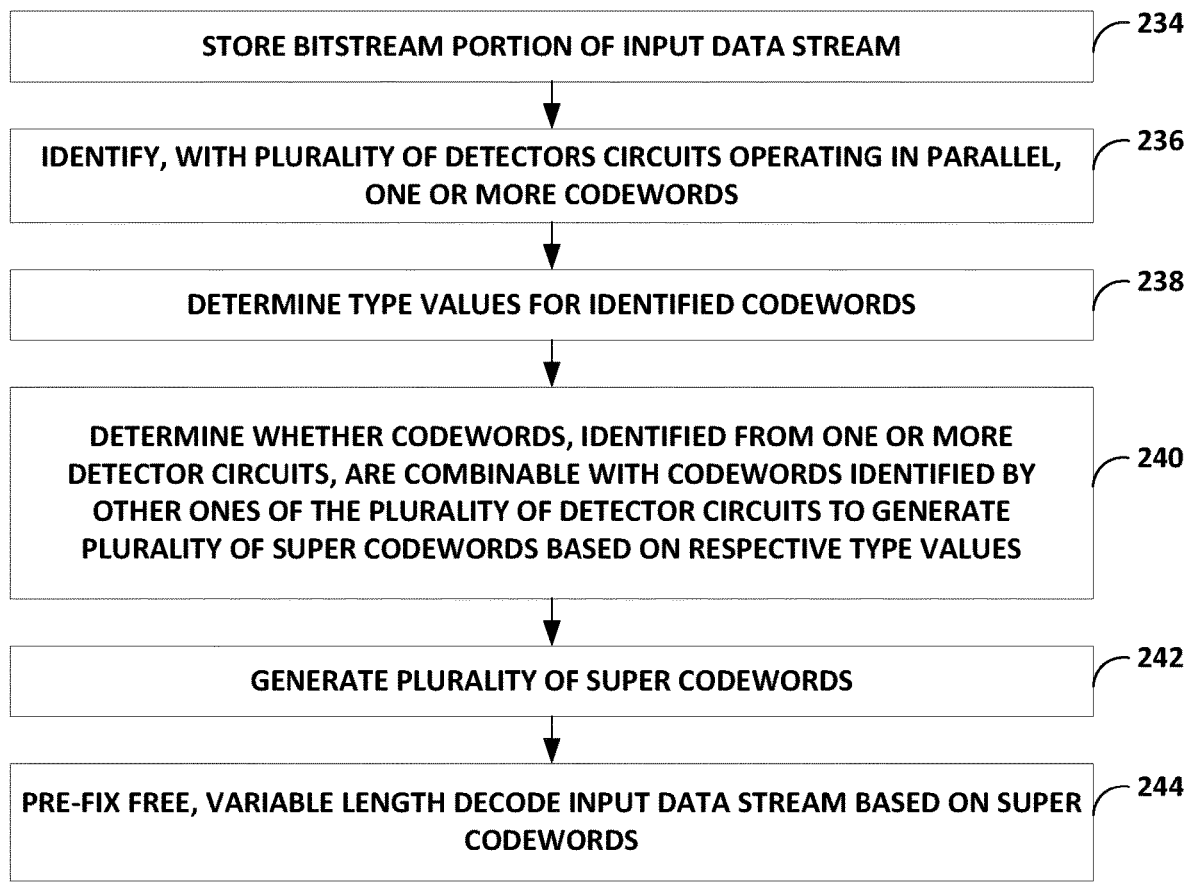
FIG. 8 is a flowchart illustrating an example method of operation.

FIG. 8 is a flowchart illustrating an example method of operation. The example operations of FIG. 8 may be considered as performing speculative decoding of codewords starting at all possible positions in a data stream portion to produce minimal information about the codeword position and type.

As illustrated, memory 218 (FIG. 7) may store a data stream portion (234). For example, one or more flip-flops may clock-in bit A-bit N into memory 218, where bit A-bit N are bits of an input data stream that decoder circuit 216 receives. As one example, the data stream portion stored in memory 218 is a flit.

Plurality of detector circuits 220 and 222, operating in parallel starting from sequential bits of common input data stream, may identify one or more codewords within the input data stream (236). As one example, detector circuit 220A may, starting from a bit in a first position within the input data stream, append sequential bits of the input data stream until forming a first codeword identified in codeword table 234, and detector circuit 220B may, starting from a bit in second position within the input data stream, append sequential bits of the input data stream until forming a second codeword identified in codeword table 234.

Plurality of detector circuits 220 and 222 may determine type values for the one or more identified codewords (236). For example, any codeword from plurality of detector circuits 222 may be of a distance type. In this example, plurality of detector circuits 222 identifying a codeword is considered as plurality of detector circuits 222 determining type values for the codewords. For plurality of detector circuits 220, plurality of detector circuits 220 may determine codewords of a literal type, a length type, or end type, as three examples. For instance, if the value of the codeword is 0 to 255, plurality of detector circuits 220 may determine that the codeword is a literal type, if the value is 256, plurality of detector circuits 220 may determine that the codeword is an end type, and if the value is 257 to 285, plurality of detector circuits 220 may determine that the codeword is a length type.

The literal type is indicative of a literal byte. The length type is indicative of a run of a plurality of previously outputted literal bytes. The distance type is indicative of a distance from a current position to a previously outputted literal byte. The end type is indicative of the end of block or packet.

Plurality of fuser circuits 226 may determine whether codewords identified from one or more of plurality of detectors 220 and 222 are combinable with codewords identified by other ones of plurality of detectors 220 and 222 to generate a plurality of super codewords based on respective type values of the codewords (240). Plurality of fuser circuits 226 may generate the plurality of super codewords based on the determination of whether the codewords are combinable (242).

As one example, assume that a first detector circuit of the plurality of detector circuits 220 and 222 identified a first codeword, and a second detector circuit of the plurality of detector circuits 220 and 22 identified a second codeword. In this example, the first detector circuit may determine a type value for the first codeword, and the second detector circuit may determine a type value of the second codeword.

A fuser circuit of plurality of fuser circuits 226 may determine whether the first codeword is combinable with a second codeword to generate a super codeword of the plurality of codewords based on the type value of the first codeword and the type value of the second codeword. In this example, a first bit of the second codeword is immediately subsequent to a last bit of the first codeword in the input data stream. Based on the determination that the first identified codeword is combinable with the second identified codeword the fuser circuit of the plurality of fuser circuits 226 may generate the super codeword of the plurality of super codewords.

For instance, a first set of detector circuits (e.g., detector circuits 220) are configured to detect codewords having a literal type or a length type, and a second set of detector circuits (e.g., detector circuit 222) are configured to detect codewords having a distance type. In this example, to determine whether codewords identified from one or more of the plurality of detectors are combinable, fuser circuits 226 may determine that the first codeword is of the length type. In this example, the first detector circuit is one of the first set of detector circuits. Fuser circuits 226 may determine that the second codeword is of the distance type. In this example, the second detector circuit is one of the second set of detector circuits. Fuser circuits 226 may determine that the first codeword is combinable with the second codeword based on the first codeword being of the length type and the second codeword being of the distance type.

As another example, similar to above, the first set of detector circuits are configured to detect codewords having a literal type or a length type, and the second set of detector circuits are configured to detect codewords having a distance type. In this example, to determine whether codewords identified from one or more of the plurality of detectors are combinable, fuser circuits 226 may determine that the first codeword is of the literal type. In this example, the first detector circuit is one of the first set of detector circuits. Fuser circuits 226 may determine that the second codeword is of the literal type. In this example, the second detector circuit is one of the first set of detector circuits. Fuser circuits 226 may determine that the first codeword is combinable with the second codeword based on the first codeword being of the literal type and the second codeword being of the literal type.

In some example, plurality of fuser circuits 226 are a plurality of fuser circuits of a first level, and the plurality of super codewords are a plurality of super codewords of a first level. In such example, fuser circuits 228 of a second level may receive the plurality of super codewords of the first level from the plurality of fuser circuits 226 of the first level. Fuser circuits 228 may determine whether super codewords from one or more fuser circuits 226 of the first level are combinable with other ones of the super codewords of the first level to generate a plurality of super codewords of a second level based on respective type values of codewords in the super codewords of the first level. Fuser circuits 228 may generate the plurality of super codewords of the second level based on determination of whether super codewords from fuser circuits 226 are combinable.

Although two levels of fuser circuits (e.g., fuser circuits 226 and 228) are illustrated in FIG. 7, the example techniques are not so limited. In some examples, there may be fuser circuits at multiple levels configured to generate super codewords at multiple levels based on type values of codewords in previous levels.

Decoder pipeline circuits 232 may be configured to prefix-free variable-length decode the input data stream based on one or more of the generated super codewords (244). As one example, decoder pipeline circuits 232 may be configured to prefix-free, variable length decode the input data stream based on one or more of the generated super codewords until parsing a codeword having a type value of end type. Prefix-free, variable length decode means that the codewords that are to be decoded are variable length. Prefix-free means that any one codeword cannot be a prefix to another other codeword. To prefix-free, variable length decode, each one of decoder pipeline circuits 232 may identify the codeword in codeword table 234, and identify the corresponding symbol.

In this manner, the example techniques may increase the decoding throughput using parallel detector circuits and a plurality of decoding pipeline circuits, as compared to serial processing. Some other techniques utilized complicated ternary content-addressable memory (TCAM) for high-speed memory searches for expanding all possible combinations of a limited number of neighboring codewords, but such techniques also resulted in poor throughput.

Figure 9:
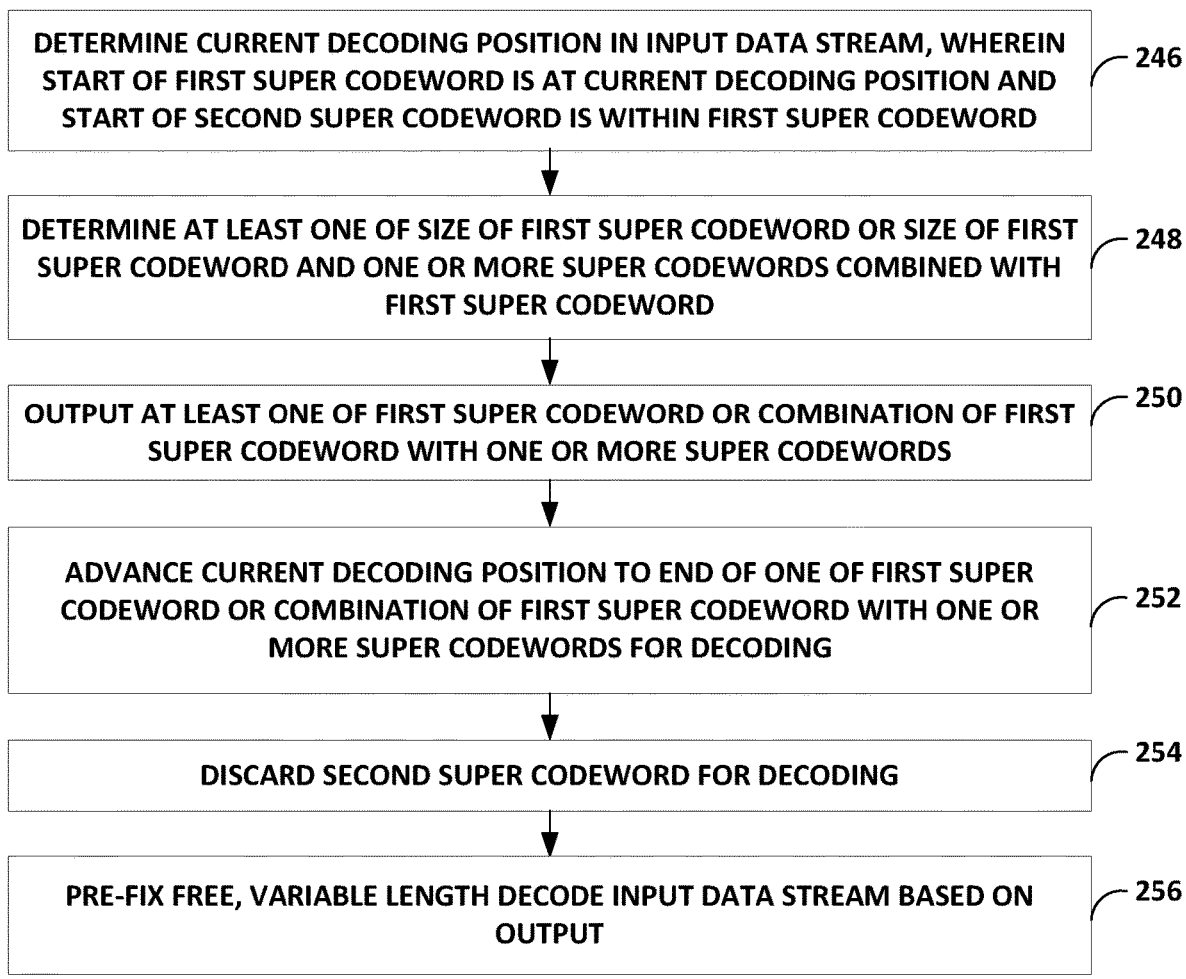
FIG. 9 is a flowchart illustrating another example method of operation.

FIG. 9 is a flowchart illustrating an example method of operation. FIG. 9 illustrates an example of ways in which super codewords are outputted for prefix-free, variable length decoding. As one example, selector circuit 230 may determine a current decoding position in the input data stream. For example, a start of a first super codeword is at the current decoding position, and, in this example, a start of a second super codeword is within the first super codeword (246). Selector circuit 230 may receive both the first and the second super codeword (possibly combined with other super codewords).

Selector circuit 230 may determine at least one of a size of the first super codeword or a size of the first super codeword and one or more super codewords combined with the first super codeword (248). For example, in examples where there are no level two fuser circuits 228, selector circuit 230 may receive a super codeword from one of fuser circuit 226. In examples where there are level two fuser circuits 228, selector circuit 230 may receive the super codeword combined with one or more super codewords from one of fuser circuits 228. The same would apply if there are multiple levels of fuser circuits.

Selector circuit 230 may output at least one of the first super codeword or the combination of the first super codeword with the one or more super codewords for decoding (250). Selector circuit 230 may advance the current decoding position to the end of one of the first super codeword or the combination of the first super codeword with the one or more super codewords for decoding (252).

In this example, selector circuit 230 may discard the second super codeword for decoding (254). For instance, in this example, the second super codeword started in the middle of the first super codeword. Because selector circuit 230 outputted the first super codeword or the combination of the first super codeword and the one or more super codewords, selector circuit 230 skipped over the second super codeword and discarded the second super codeword. In this example, prefix-free, variable length decoding the input data stream based on one or more of the generated super codewords includes prefix-free, variable length decoding the input data stream based on the outputting from selector circuit 230 (256).

Various examples have been described. These and other examples are within the scope of the following claims.

What is claimed is:

1. A method of codeword processing, the method comprising:
   identifying, with a plurality of detector circuits operating in parallel starting from respective bits of sequential bits of an input data stream, one or more codewords within the input data stream;
   determining, with the plurality of detector circuits operating in parallel, type values for the one or more identified codewords;
   determining, with a plurality of fuser circuits, whether codewords identified from one or more of the plurality of detector circuits are combinable with codewords identified by other ones of the plurality of detector circuits to generate a plurality of super codewords based on respective type values of the codewords, wherein determining whether codewords identified from one or more of the plurality of detector circuits are combinable comprises determining, with one of the plurality of fuser circuits, whether a first codeword and an immediately following second codeword, in the input data stream, identified by a first detector circuit and a second detector circuit of the plurality of detector circuits, respectively, are combinable based on at least the type values of the first codeword and the second codeword;
   generating, with one or more of the fuser circuits, the plurality of super codewords based on the determination of whether the codewords are combinable; and
   prefix-free, variable length decoding the input data stream based on one or more of the generated super codewords.

2. The method of claim 1, further comprising:
   determining, with a selector circuit, a current decoding position in the input data stream, wherein a start of a first super codeword is at the current decoding position, and wherein a start of a second super codeword is within the first super codeword;
   determining, with the selector circuit, at least one of a size of the first super codeword or a size of the first super codeword and one or more super codewords combined with the first super codeword;
   outputting, with the selector circuit, at least one of the first super codeword or the combination of the first super codeword with the one or more super codewords for decoding;
   advancing, with the selector circuit, the current decoding position to the end of one of the first super codeword or the combination of the first super codeword with the one or more super codewords for decoding; and
   discarding, with the selector circuit, the second super codeword for decoding,
   wherein prefix-free, variable length decoding the input data stream based on one or more of the generated super codewords comprises prefix-free, variable length decoding the input data stream based on the outputting from the selector circuit.

3. The method of claim 1, wherein prefix-free, variable length decoding the input data stream based on one or more of the generated super codewords comprises prefix-free, variable length decoding the input data stream until parsing a codeword having a type value of end type.

4. The method of claim 1, wherein the type values for the one or more identified codewords comprise one of:
   a literal type indicative of a literal byte;
   a length type indicative of a run of a plurality of previously outputted literal bytes;

a distance type indicative of a distance from a current position to a previously outputted literal byte; or
an end type indicative of end of block.

5. The method of claim 1,
wherein identifying comprises identifying, with the first detector circuit of the plurality of detector circuits, the first codeword, and identifying, with the second detector circuit of the plurality of detector circuits, the second codeword,
wherein determining type values comprises determining a type value for the first codeword and a type value for the second codeword, and
wherein generating the plurality of super codewords comprises generating, with a fuser circuit of the plurality of fuser circuits, a super codeword of the plurality of super codewords based on the determination that the first codeword is combinable with the second codeword.

6. The method of claim 5, wherein the plurality of detector circuits comprises a first set of detector circuits and a second set of detector circuits, wherein the first set of detector circuits are configured to detect codewords having a literal type or a length type, and the second set of detector circuits are configured to detect codewords having a distance type, wherein determining whether codewords identified from one or more of the plurality of detectors are combinable comprises:
determining that the first codeword is of the length type, wherein the first detector circuit is one of the first set of detector circuits;
determining that the second codeword is of the distance type, wherein the second detector circuit is one of the second set of detector circuits; and
determining that the first codeword is combinable with the second codeword based on the first codeword being of the length type and the second codeword being of the distance type.

7. The method of claim 5, wherein the plurality of detector circuits comprises a first set of detector circuits and a second set of detector circuits, wherein the first set of detector circuits are configured to detect codewords having a literal type or a length type, and the second set of detector circuits are configured to detect codewords having a distance type, wherein determining whether codewords identified from one or more of the plurality of detectors are combinable comprises:
determining that the first codeword is of the literal type, wherein the first detector circuit is one of the first set of detector circuits;
determining that the second codeword is of the literal type, wherein the second detector circuit is one of the first set of detector circuits; and
determining that the first codeword is combinable with the second codeword based on the first codeword being of the literal type and the second codeword being of the literal type.

8. The method of claim 1, wherein the plurality of fuser circuits comprises a plurality of fuser circuits of a first level, and the plurality of super codewords comprises a plurality of super codewords of a first level, the method further comprising:
receiving, with a plurality of fuser circuits of a second level, the plurality of super codewords of the first level from the plurality of fuser circuits of the first level;
determining, with the plurality of fuser circuits of the second level, whether super codewords from one or more fuser circuits of the first level are combinable with other ones of the super codewords of the first level to generate a plurality of super codewords of a second level based on respective type values of codewords in the super codewords of the first level; and
generating, with the plurality of fuser circuits of the second level, the plurality of super codewords of the second level.

9. The method of claim 8, further comprising:
generating super codewords at multiple levels based on type values of codewords in previous levels,
wherein prefix-free, variable-length decoding the input data stream based on the generated super codeword comprises prefix-free, variable-length decoding the input data stream based on the generated super codeword at the last level of the multiple levels.

10. The method of claim 1, wherein identifying, with the plurality of detector circuits operating in parallel starting from respective bits of the sequential bits of the input data stream, the one or more codewords within the input data stream comprises:
starting from a bit in a first bit position within a memory storing a portion of the input data stream, appending sequential bits of the input data stream until forming a first codeword identified in a codeword table; and
starting from a bit in a second bit position within the memory storing the portion of the input data stream, appending sequential bits of the input data stream until forming a second codeword identified in the codeword table.

11. A device for codeword processing, the device comprising:
a memory configured to store bits of an input data stream;
a plurality of detector circuits, operating in parallel starting from respective bits of sequential bits of the input data stream, configured to:
identify one or more codewords within the input data stream; and
determine type values for the one or more identified codewords;
a plurality of fuser circuits configured to:
determine whether codewords identified from one or more of the plurality of detector circuits are combinable with codewords identified by other ones of the plurality of detector circuits to generate a plurality of super codewords based on respective type values of the codewords, wherein to determine whether codewords identified from one or more of the plurality of detector circuits are combinable, one of the plurality of fuser circuits is configured to determine whether a first codeword and an immediately following second codeword, in the input data stream, identified by a first detector circuit and a second detector circuit of the plurality of detector circuits, respectively, are combinable based on at least the type values of the first codeword and the second codeword; and
generate the plurality of super codewords based on the determination of whether the codewords are combinable; and
a plurality of decoder pipeline circuits configured to prefix-free, variable length decode the input data stream based on one or more of the generated super codewords.

12. The device of claim 11, further comprising:
a selector circuit configured to:
determine a current decoding position in the input data stream, wherein a start of a first super codeword is at the current decoding position, and wherein a start of a second super codeword is within the first super codeword;
determine at least one of a size of the first super codeword or a size of the first super codeword and one or more super codewords combined with the first super codeword;
output at least one of the first super codeword or the combination of the first super codeword with the one or more super codewords for decoding;
advance the current decoding position to the end of one of the first super codeword or the combination of the first super codeword with the one or more super codewords for decoding; and
discard the second super codeword for decoding,
wherein to prefix-free, variable length decode the input data stream based on one or more of the generated super codewords, the decoder pipeline circuits are configured to prefix-free, variable length decode the input data stream based on the outputting from the selector circuit.

13. The device of claim 11, wherein to prefix-free, variable length decode the input data stream based on one or more of the generated super codewords, the plurality of decoder pipeline circuits are configured to prefix-free, variable length decode the input data stream until parsing a codeword having a type value of end type.

14. The device of claim 11, wherein the type values for the one or more identified codewords comprise one of:
a literal type indicative of a literal byte;
a length type indicative of a run of a plurality of previously outputted literal bytes;
a distance type indicative of a distance from a current position to a previously outputted literal byte; or
an end type indicative of end of block.

15. The device of claim 11,
wherein the first detector circuit of the plurality of detector circuits is configured to identify the first codeword, and the second detector circuit of the plurality of detector circuits is configured to identify the second codeword,
wherein to determine type values, the first detector circuit is configured to determine a type value for the first codeword, and the second detector circuit is configured to determine a type value for the second codeword, and
wherein to generate the plurality of super codewords, the fuser circuit is configured to, based on the determination that the first codeword is combinable with the second codeword, generate a super codeword of the plurality of super codewords.

16. The device of claim 15, wherein the plurality of detector circuits comprises a first set of detector circuits and a second set of detector circuits, wherein the first set of detector circuits are configured to detect codewords having a literal type or a length type, and the second set of detector circuits are configured to detect codewords having a distance type, wherein to determine whether codewords identified from one or more of the plurality of detectors are combinable, the fuser circuit is configured to:
determine that the first codeword is of the length type, wherein the first detector circuit is one of the first set of detector circuits;
determine that the second codeword is of the distance type, wherein the second detector circuit is one of the second set of detector circuits; and
determine that the first codeword is combinable with the second codeword based on the first codeword being of the length type and the second codeword being of the distance type.

17. The device of claim 15, wherein the plurality of detector circuits comprises a first set of detector circuits and a second set of detector circuits, wherein the first set of detector circuits are configured to detect codewords having a literal type or a length type, and the second set of detector circuits are configured to detect codewords having a distance type, wherein to determine whether codewords identified from one or more of the plurality of detectors are combinable, the fuser circuit is configured to:
determine that the first codeword is of the literal type, wherein the first detector circuit is one of the first set of detector circuits;
determine that the second codeword is of the literal type, wherein the second detector circuit is one of the first set of detector circuits; and
determine that the first codeword is combinable with the second codeword based on the first codeword being of the literal type and the second codeword being of the literal type.

18. The device of claim 11, wherein the plurality of fuser circuits comprises a plurality of fuser circuits of a first level, and the plurality of super codewords comprises a plurality of super codewords of a first level, wherein the device further comprises a plurality of fuser circuits of a second level configured to:
receive the plurality of super codewords of the first level from the plurality of fuser circuits of the first level;
determine whether super codewords from one or more fuser circuits of the first level are combinable with other ones of the super codewords of the first level to generate a plurality of super codewords of a second level based on respective type values of codewords in the super codewords of the first level; and
generate the plurality of super codewords of the second level.

19. The device of claim 18, further comprising plurality of fuser circuits at multiple levels configured to:
generate super codewords at multiple levels based on type values of codewords in previous levels,
wherein to prefix-free, variable-length decode the input data stream based on the generated super codeword, the plurality of decoder pipeline circuits are configured to prefix-free, variable-length decode the input data stream based on the generated super codeword at the last level of the multiple levels.

20. The device of claim 11, wherein to identify the one or more codewords within the input data stream, the plurality of detector circuits are configured to:
starting from a bit in a first bit position within a memory storing a portion of the input data stream, append sequential bits of the input data stream until forming a first codeword identified in a codeword table; and
starting from a bit in a second bit position within the memory storing the portion of the input data stream, append sequential bits of the input data stream until forming a second codeword identified in the codeword table.

21. A device for codeword processing, the device comprising:
a memory configured to store bits of an input data stream;
a plurality of detector circuits, operating in parallel starting from respective bits of sequential bits of the input data stream, configured to:

identify one or more codewords within the input data stream; and determine type values for the one or more identified codewords;

a plurality of fuser circuits configured to:

determine whether codewords identified from one or more of the plurality of detector circuits are combinable with codewords identified by other ones of the plurality of detector circuits to generate a plurality of super codewords based on respective type values of the codewords; and generate the plurality of super codewords based on the determination of whether the codewords are combinable;

a selector circuit configured to:

determine a current decoding position in the input data stream, wherein a start of a first super codeword is at the current decoding position, and wherein a start of a second super codeword is within the first super codeword;

determine at least one of a size of the first super codeword or a size of the first super codeword and one or more super codewords combined with the first super codeword;

output at least one of the first super codeword or the combination of the first super codeword with the one or more super codewords for decoding;

advance the current decoding position to the end of one of the first super codeword or the combination of the first super codeword with the one or more super codewords for decoding; and discard the second super codeword for decoding; and a plurality of decoded pipeline circuits configured to prefix-free, variable length decode the input data stream based on the outputting from the selector circuit.

* * * * *